US009542987B2

(12) United States Patent
Naik et al.

(10) Patent No.: US 9,542,987 B2
(45) Date of Patent: Jan. 10, 2017

(54) MAGNETIC MEMORY CELLS WITH LOW SWITCHING CURRENT DENSITY

(71) Applicant: GLOBALFOUNDRIES Singapore Pte. Ltd., Singapore (SG)

(72) Inventors: Vinayak Bharat Naik, Singapore (SG); Eng Huat Toh, Singapore (SG); Kiok Boone Elgin Quek, Singapore (SG)

(73) Assignee: GLOBALFOUNDRIES SINGAPORE PTE. LTD., Sinagpore (SG)

( * ) Notice: Subject to any disclaimer, the term of this patent is extended or adjusted under 35 U.S.C. 154(b) by 0 days.

(21) Appl. No.: 15/012,798

(22) Filed: Feb. 1, 2016

(65) Prior Publication Data

US 2016/0225423 A1    Aug. 4, 2016

Related U.S. Application Data

(60) Provisional application No. 62/110,600, filed on Feb. 2, 2015.

(51) Int. Cl.
| | |
|---|---|
| *G11C 11/15* | (2006.01) |
| *G11C 11/16* | (2006.01) |
| *H01L 43/02* | (2006.01) |
| *H01L 43/12* | (2006.01) |
| *H01L 27/22* | (2006.01) |

(52) U.S. Cl.
CPC .............. *G11C 11/161* (2013.01); *G11C 11/15* (2013.01); *H01L 27/228* (2013.01); *H01L 43/02* (2013.01); *H01L 43/12* (2013.01)

(58) Field of Classification Search
CPC .................................. G11C 11/16; G11C 11/15
USPC ..................................................... 365/158, 173
See application file for complete search history.

(56) References Cited

U.S. PATENT DOCUMENTS

| | | | |
|---|---|---|---|
| 7,230,308 B2 | 6/2007 | Iwata | |
| 2011/0216581 A1* | 9/2011 | Liu | B82Y 25/00 365/158 |
| 2014/0056061 A1* | 2/2014 | Khvalkovskiy | H01L 43/02 365/158 |
| 2014/0264671 A1* | 9/2014 | Chepulskyy | H01L 43/08 257/421 |
| 2015/0129995 A1* | 5/2015 | Wang | G11C 11/18 257/421 |

* cited by examiner

*Primary Examiner* — Michael Tran
(74) *Attorney, Agent, or Firm* — Horizon IP Pte. Ltd.

(57) ABSTRACT

Memory cells and methods for forming a memory cell are disclosed. The memory cell includes a substrate defined with a memory cell region. A cell selector unit is defined on the substrate. The cell selector unit includes at least one select transistor. A storage element which includes a magnetic tunnel junction (MTJ) element is coupled to the selector unit. The MTJ element includes a free layer, a fixed layer and a tunnel barrier sandwiched between the fixed and free layers. A spin-orbit-torque (SOT) layer is coupled to the selector unit and is in direct contact with the free layer. A strain induced layer is coupled to a digital line (DL) and is in direct contact with the SOT layer. When the DL is activated, an electric field applied to the strain induced layer induces a strain on the SOT layer.

20 Claims, 40 Drawing Sheets

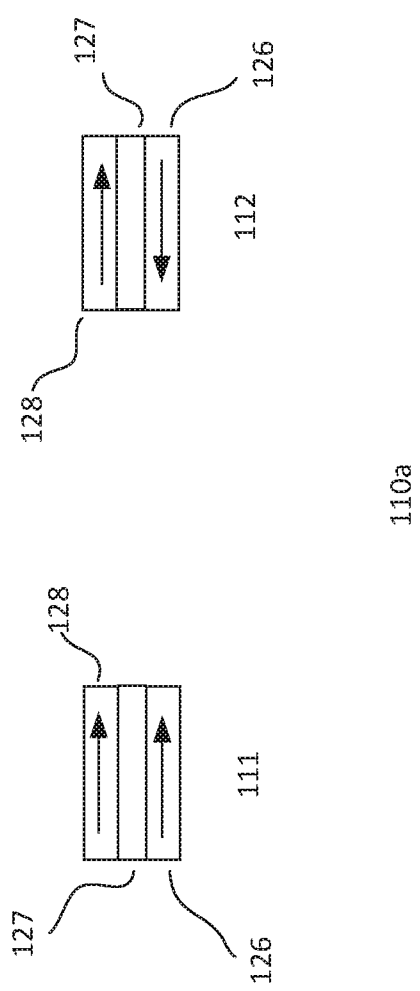

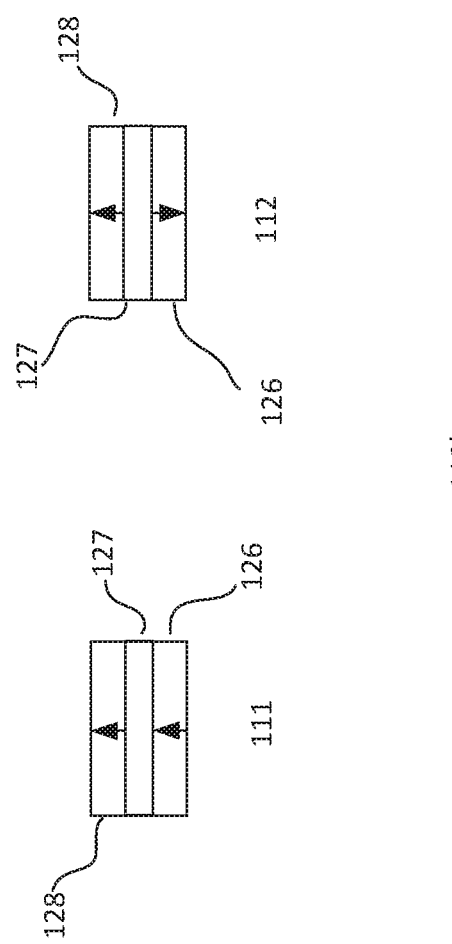

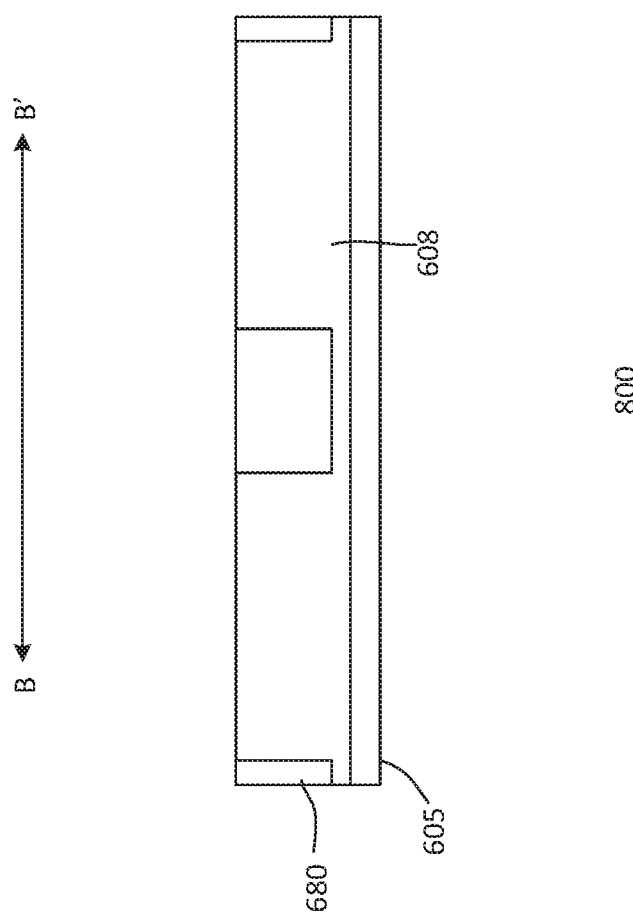

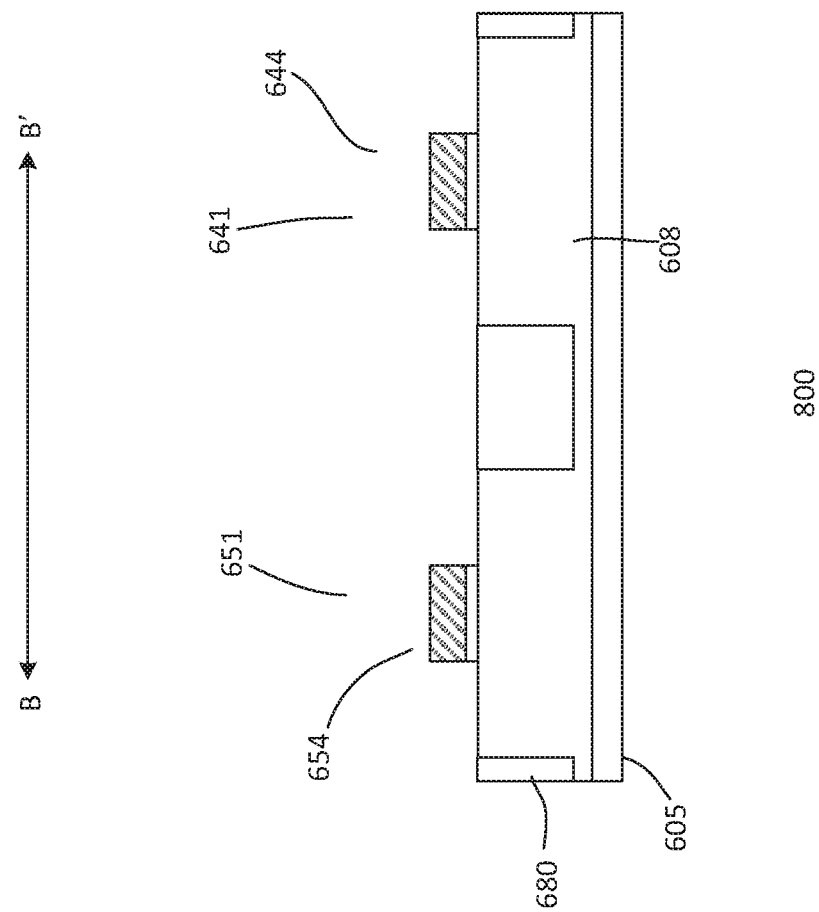

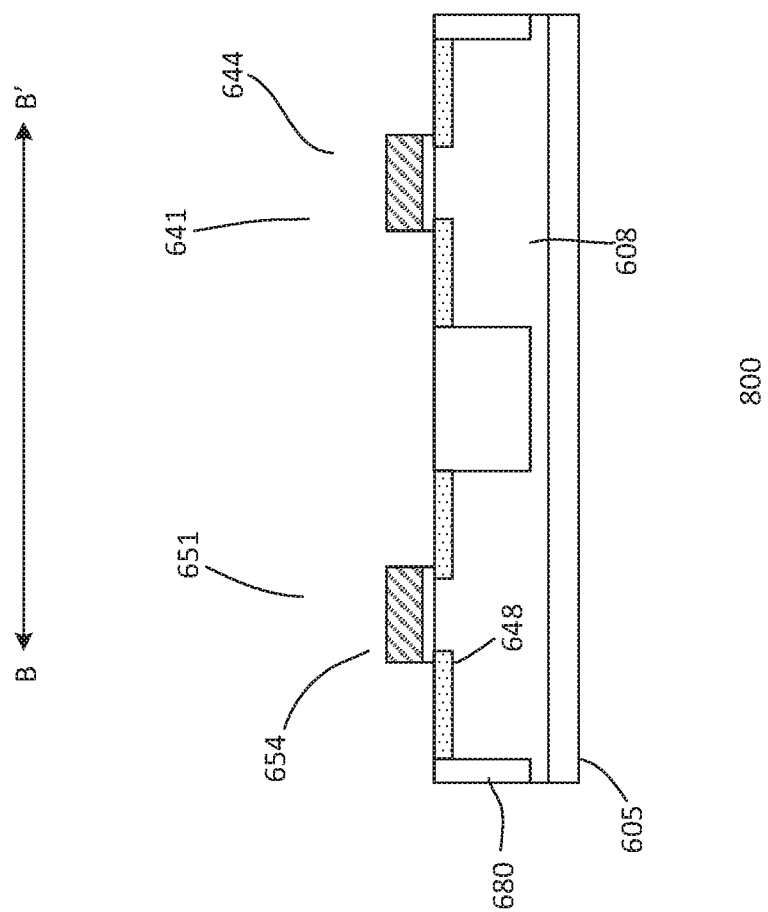

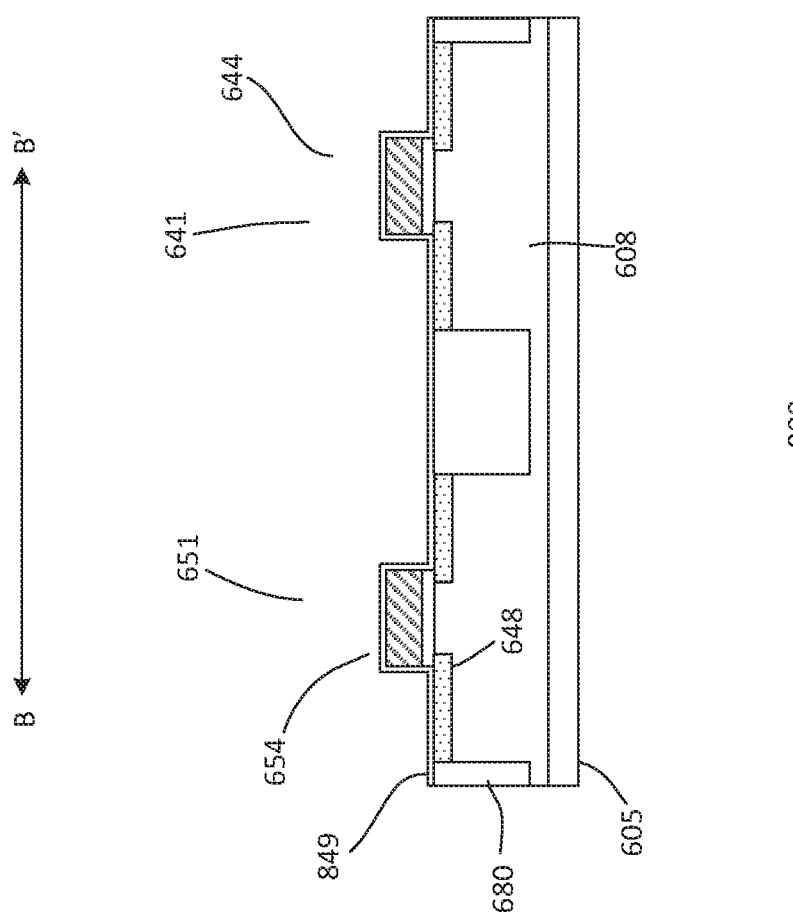

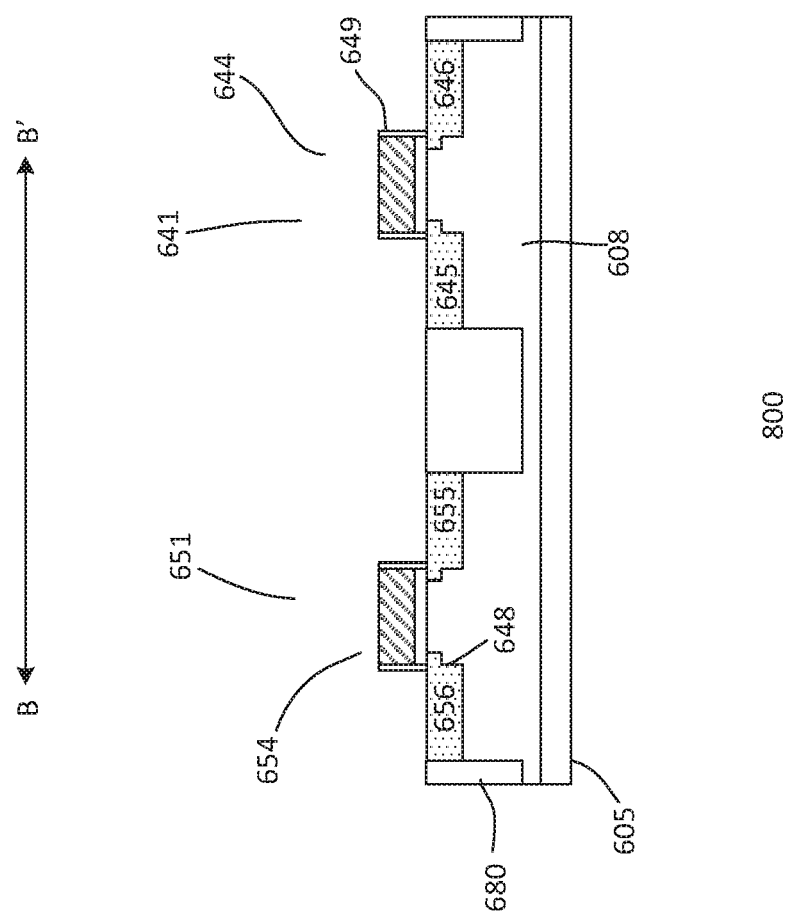

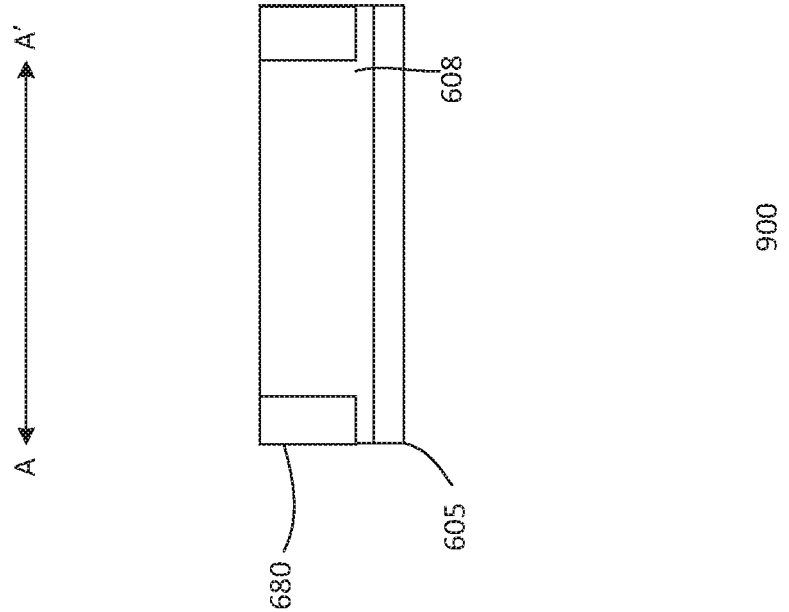

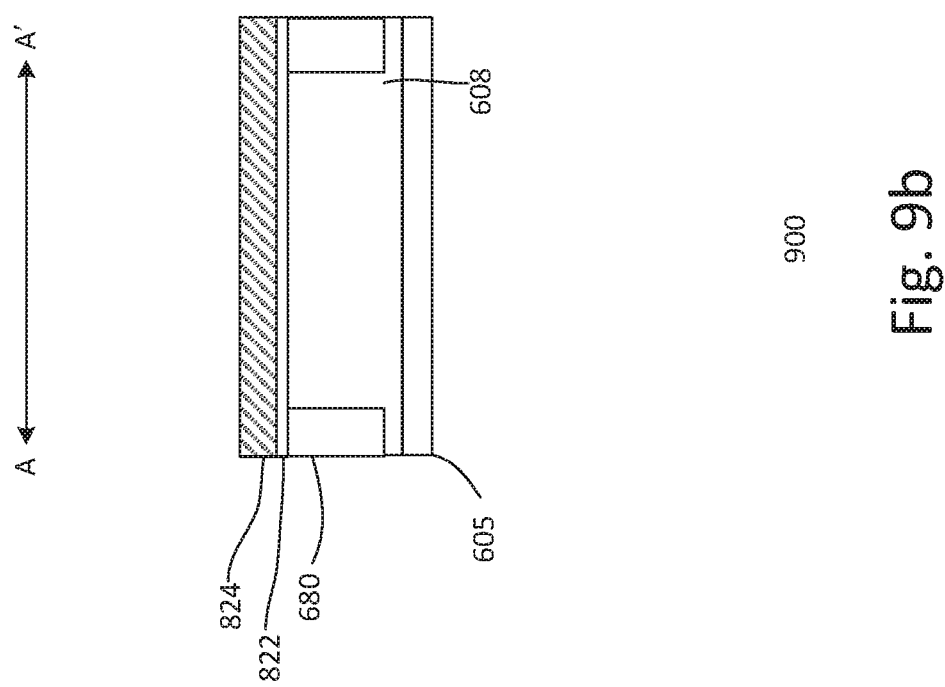

MAGNETIC MEMORY CELLS WITH LOW SWITCHING CURRENT DENSITY

CROSS-REFERENCE TO RELAYED ED APPLICATION

This application claims the benefit of U.S. Provisional Application Ser. No. 62/110,600, filed on Feb. 2, 2015, which is herein incorporated by reference in its entirety for all purposes.

BACKGROUND

Advances in the field of spin-transport and magnetism have contributed to the development of spintronic devices including spin transfer torque random access memory (STT-MRAM) cells. STT-MRAM devices may serve as potential candidate to replace static random access memory (SRAM) and dynamic random access memory (DRAM). Nevertheless, STT-MRAM may suffer from reliability and endurance issues due to the rapid aging of the tunnel barrier of the magnetic tunnel junction (MTJ) element of the STT-MRAM by the high writing current density as well as erroneous writing by the read current since the READ and WRITE paths are generally the same in STT-MRAM.

Spin-Orbit-Torque (SOT)-MRAM may be an alternative to STT-MRAM as the READ and WRITE paths are different and may mitigate the issues suffered by STT-MRAM. However, the switching current of the conventional SOT-MRAM is still very high and undesirably consumes considerable amount of power.

From the foregoing discussion, it is desirable to provide energy efficient and reliable magnetic memory cells.

SUMMARY

Embodiments of the present disclosure generally relate to memory devices and methods for forming a memory device. In one embodiment, a memory cell is disclosed. The memory cell includes a substrate defined with a memory cell region. A cell selector unit is defined on the substrate. The cell selector unit includes at least one select transistor. A storage element which includes a magnetic tunnel junction (MTJ) element is coupled to the selector unit. The MTJ element includes a free layer, a fixed layer and a tunnel barrier sandwiched between the fixed and free layers. A spin-orbit-torque (SOT) layer is coupled to the selector unit and is in direct contact with the free layer. A strain induced layer is coupled to a digital line (DL) and is in direct contact with the SOT layer. When the DL is activated, an electric field applied to the strain induced layer induces a strain on the SOT layer.

In another embodiment, a method of operating a memory cell is presented. The method includes providing a memory cell having a substrate defined with a memory cell region. A cell selector unit is defined on the substrate. The cell selector unit includes at least one select transistor. The memory cell also includes a storage element having a magnetic tunnel junction (MTJ) element coupled to the selector unit. The MTJ element includes a free layer, a fixed layer and a tunnel barrier sandwiched between the fixed and free layers. A spin-orbit-torque (SOT) layer is coupled to the selector unit and is in direct contact with the free layer. A strain induced layer is coupled to a digital line (DL) and in direct contact with the SOT layer. The method also includes performing a read operation or write operation with the memory cell. When a write operation is performed, a write path is formed through the SOT layer. When the DL is activated, an electric field to applied to the strain induced layer induces a strain on the SOT layer which reduces magnetic anisotropy of the free layer that is in direct contact with the SOT layer.

In yet another embodiment, a method of forming a memory cell is presented. The method includes providing a substrate defined with a memory cell region. A cell selector unit is formed on the substrate. Forming the cell selector unit includes forming at least one select transistor. A storage element which includes a magnetic tunnel junction (MTJ) element is formed and is coupled to the selector unit. The MTJ element includes a free layer, a fixed layer and a tunnel barrier sandwiched between the fixed and free layers. A spin-orbit-torque (SOT) layer is formed and the SOT layer is coupled to the selector unit. The SOT layer is formed below and in direct contact with the free layer. The method includes forming a strain induced layer and coupling the strain induced layer to a digital line (DL) and in direct contact with the SOT layer. When the DL is activated, an electric field applied to the strain induced layer induces a strain on the SOT layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show diagrams of parallel and anti-parallel states of magnetic tunneling junction (MTJ) elements;

FIGS. 9a-9l show cross-sectional views of another embodiment of a process for forming a device with a memory cell.

DETAILED DESCRIPTION

Figure 2:
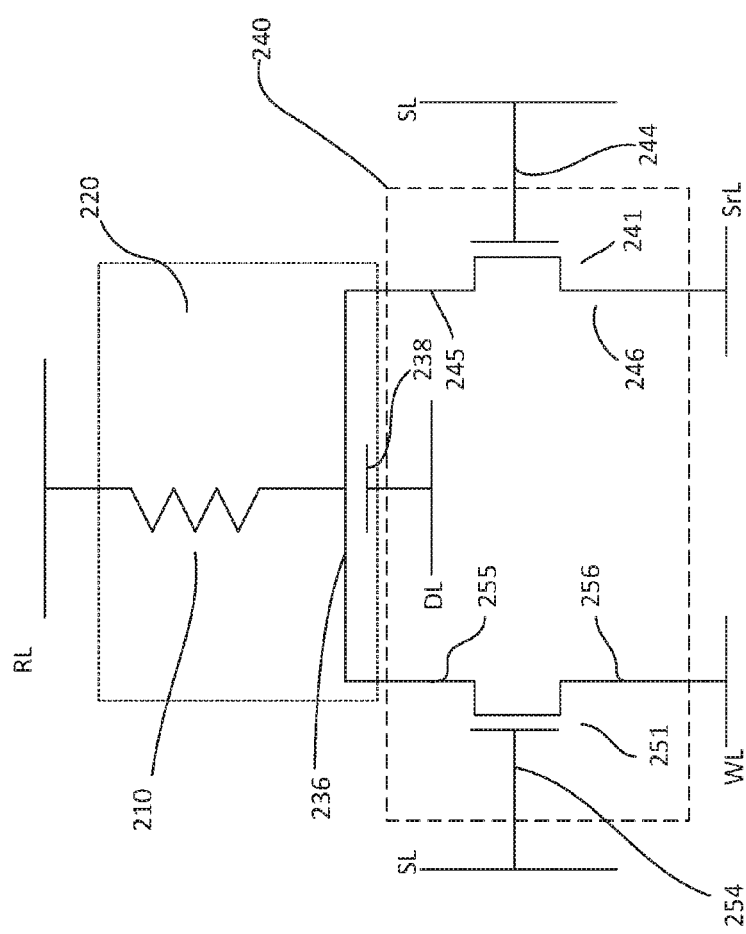
FIGS. 2-3 show schematic diagrams of various embodiments of a memory cell.

Embodiments of the present disclosure generally relate to memory cells. In one embodiment, the memory cells are magnetic resistive memory cells, such as magnetic random access memory (MRAM). The MRAM includes spin-orbit-torque (SOT) MRAM having magnetic tunneling junction (MTJ) element as the storage element. Other suitable types of resistive memory cells may also be useful. The memory cells as presented in this disclosure are relatively compact and energy efficient as low switching current is required for write operation of the memory cell. The memory cells can be incorporated into or used with, for example, electronic products such as mobile phones, smart cards, mass storage, enterprise storage and industrial and automotive products.

FIG. 1a shows a simplified cross-sectional view of an embodiment of a MTJ element 110a. As shown, the magnetization or magnetic orientations of the magnetic element are configured to be in a horizontal direction. Horizontal direction, for example, refers to a direction along or parallel to a substrate surface. A MTJ element includes a magnetically free layer 126, a tunneling barrier layer 127 and a magnetically fixed (pinned) layer 128. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in the first or parallel direction as the fixed layer. The corresponding MTJ electrical resistance between the free layer 126 and the fixed layer 128 is denoted as RP. Structure 112 illustrates that the magnetization of the free layer is programmed to be in a second or anti-parallel direction as the fixed layer. The corresponding MTJ electrical resistance between the free layer 126 and the fixed layer 128 is denoted as RAP. The resistance RAP is higher than the resistance RP.

FIG. 1b shows magnetic orientations in the magnetic layers of a MTJ element 110b in a vertical direction. Vertical direction, for example, refers to a direction perpendicular to a substrate surface. As shown in FIG. 1b, MTJ element 110b includes a free layer 126, a barrier layer 127 and a fixed (pinned) layer 128. When the MTJ element 110b is in a magnetic parallel state, magnetic orientations of the free layer 126 and the fixed layer 128 are in the same direction as shown by structure 111. The corresponding MTJ electrical resistance between the free layer 126 and the fixed layer 128 is denoted as $R_P$. When the MTJ element 110b is in a magnetic anti-parallel state, magnetic orientations of the free layer 126 and the fixed layer 128 are in opposite directions as shown by structure 112. The corresponding MTJ electrical resistance between the free layer 126 and the fixed layer 128 is denoted as $R_{AP}$.

As shown in FIGS. 1a-1b, the MTJ stacks are top pinned stacks. For example, in a top pinned stack, the free layer is disposed below the fixed layer. In other embodiments, the MTJ stacks may be bottom pinned MTJ stacks. For example, the fixed layer may be disposed below the free layer.

The MTJ element, as described, is a simplified description. In actuality, the MTJ element may include other layers, such as top and/or bottom electrodes, capping layer between the stack and top electrode. In addition, the fixed or reference layer may include multiple layers. For example, the fixed layer may include a pinning layer. The pinning layer serves as a hard magnet for fixing the magnetization of the reference layer. By way of example, the free layer and the reference layer may be CoFeB or CoFe based composite material and the tunneling barrier layer may be MgO or $Al_2O_3$. As for the pinning layer, it may be PtMn, IrMn or multilayers of (Co/Pt), (Co/Ni), etc. while the top and bottom electrodes may be TaN or Ta. Other suitable materials for the MTJ stack may also be useful. The MTJ stack may include other layers as well. Other suitable configurations of MTJ element or stack may also be useful. A description of MTJ elements may be found in, for example, *Materials Today Journal*, Volume 9, Issue 11, pages 36-45 (November 2006), which is herein incorporated by reference for all purposes.

FIG. 2 shows a schematic diagram of an embodiment of a memory cell 200. The memory cell is a non-volatile memory cell. For example, the memory cell may be a magnetic memory cell. In one embodiment, the memory cell is a Spin-Orbit-Torque Magnetic Random Access Memory (SOT-MRAM) cell. The memory cell includes a storage unit 220 and a cell selector unit 240. The storage unit is coupled to the cell selector unit. The storage unit 220, in one embodiment, includes a storage element 210. The storage element, for example, may be a resistive storage element. In one embodiment, the storage element is a magnetic resistive memory storage element, such as a MTJ storage element 210. The MTJ element may include MTJ elements such as those described in FIGS. 1a-1b. Other suitable types of MTJ or resistive storage elements may also be useful.

In one embodiment, the MTJ element is a top pinned perpendicular MTJ element. Other types of MTJ elements, such as horizontal or bottom pinned MTJ elements may also be useful. The top of the MTJ stack is coupled to a bitline BL (or read line RL) while the bottom of the MTJ stack is coupled to the selector unit. In some cases, the MTJ element may include top and/or bottom electrodes (not shown). For example, the top electrode is disposed over the top of the MTJ element and the bottom electrode is disposed below the MTJ stack. In such cases, the top electrode is coupled to the RL of the memory cell while the bottom electrode is coupled to the selector unit.

As for the cell selector unit 240, it includes first and second selectors or selector subunits 241 and 251. The first selector subunit 241, for example, may be a read selector and the second selector subunit 251 may be a write selector. A selector subunit includes a select transistor. For example, the first selector subunit includes a first select transistor and the second selector subunit includes a second select transistor. A select transistor of a subunit is, for example, a metal oxide semiconductor (MOS) transistor. In one embodiment, the select transistor is an n-type MOS transistor. Providing a p-type MOS transistor as a select transistor may also be useful. Other types of transistors or selectors may also be useful. In some embodiments, diodes may be used below the DL to apply an electric field to only the selected bit.

The first select transistor 241 includes first and second source/drain (S/D) terminals 245 and 246, and a gate or control terminal 244. The second select transistor 251 includes first and second S/D terminals 255 and 256, and a gate or control terminal 254. The S/D terminals are formed by, for example, heavily doped regions having the same polarity type dopants as the transistor type. For example, the S/D terminals are heavily n-doped regions for an n-type transistor. The first S/D terminals 245 and 255 may be referred to as drain terminals and the second S/D terminals 246 and 256 may be referred to as source terminals. As shown, the drain terminals of the select transistors are commonly coupled to the MTJ element. For example, the drain terminals are coupled to the bottom electrode of the MTJ element. The source terminal of the read select transistor is coupled to a source line SrL of the memory cell; the source terminal of the write select transistor is coupled to a write line WL. As for the gates of the first and second transistors, they are coupled to select lines SL. The select lines SL, for example, may be configured as a common select line SL.

The MTJ element is coupled to a spin-orbit-torque (SOT) layer 236. For example, the drain terminals of the select transistors are coupled to the SOT layer. The free layer of the MTJ element is coupled to the SOT layer. In one embodiment, the free layer is disposed on the SOT layer. For example, a top pinned MTJ element has its free layer disposed on the SOT layer. The SOT layer is disposed between a strain induced layer 238 and the MTJ element. For example, the strain induced layer is disposed below the SOT layer under the MTJ element. The strain induced layer is coupled to a digital line DL. When the DL is activated, an electric field is applied to the strain induced layer to induce a strain on the SOT layer. The strain on the SOT layer reduces the magnetic anisotropy of the free layer. This reduces the current density needed to switch the magnetization direction of the free layer.

A read line RL is coupled to the MTJ element. For example, the RL is coupled to the fixed layer of the MTJ element. A top electrode (not shown) may be disposed between the MTJ element and the RL.

In one example, during a write operation, the RL is set to "0 V" and the SLs are active or "ON" and the DL is provided with "1V". This causes the write selector and read selector to couple the WL to the SrL, forming a write path through the SOT layer. Depending on whether top pinned or bottom pinned MTJ is used, the voltage values applied to RL and DL may be swapped. When the DL is activated, an electric field applied to the strain induced layer induces a strain on the SOT layer which reduces the magnetic anisotropy of the free layer that is in direct contact with the SOT layer. Depending on the direction of the current, it causes the magnetization direction to be parallel or anti-parallel (write "0" or write "1"). For example, the current may be from WL to SrL or from SrL to WL. During a read operation, the RL, for example, is active and the WL is floated while the SLs are active. However, since the WL is floated, the read current path is from the RL to the SrL through the MTJ element and the read select transistor. Depending on whether top pinned or bottom pinned MTJ is used as well as the magnetization of the fixed layer, the voltage values applied to RL and SrL may be swapped.

Table 1 below shows exemplary signals or bias conditions applied to the memory cell of FIG. 1a for read and write operations.

TABLE 1

| Operation | Signal (V) | | | | |
| --- | --- | --- | --- | --- | --- |
| | SrL | SL | DL | WL | RL |
| Read | 0 V | 1.1 V | FLOAT | FLOAT | 0.4 V |
| Write "1" | 0 V | 1.1 V | 1 V | 1.1 V | 0 V |
| Write "0" | 1.1 V | 1.1 V | 1 V | 0 V | 0 V |

The bias conditions or voltages in the Table 1 above are for a memory cell with n-type select transistors. The voltages are exemplary and may change depending on, for example, the technology node, top or bottom pinned MTJ, as well as the type of select transistors. In addition, the bias conditions assume that 1 V on DL is sufficient to reduce the magnetic anisotropy of the free layer during WRITE, and that 0.4 V on RL is sufficient to read the MTJ element without causing read disturb error (RDE).

Figure 3:
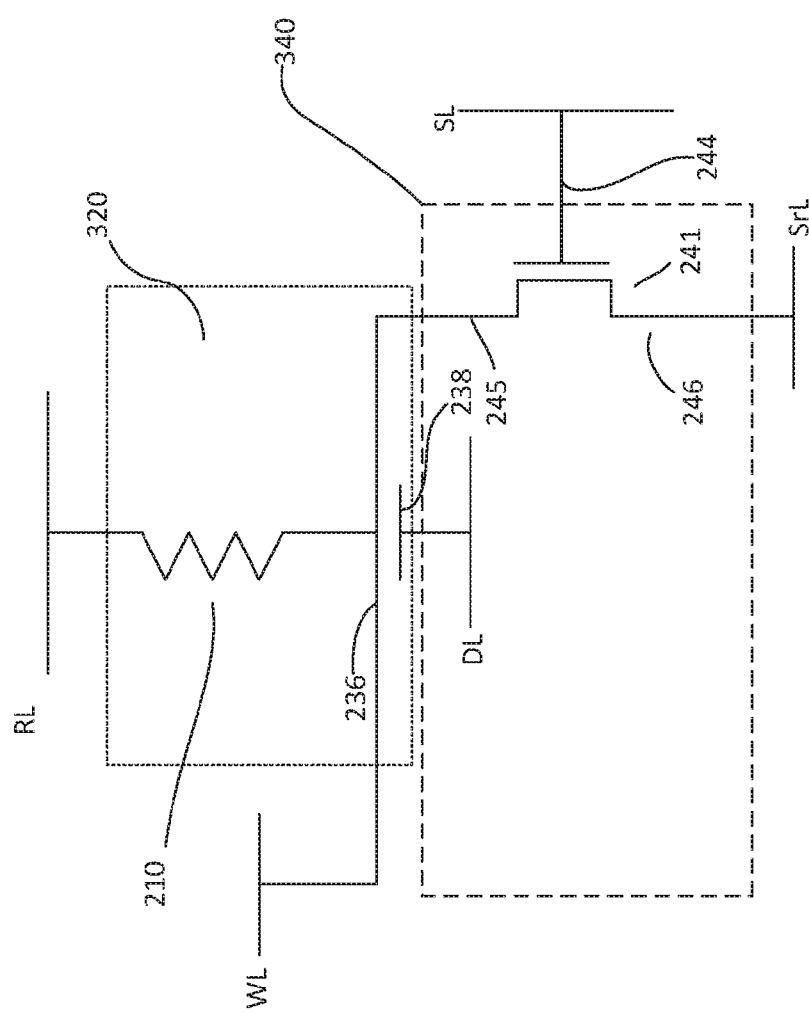

FIG. 3 shows a schematic diagram of another embodiment of a memory cell 300. The memory cell is a non-volatile memory cell, such as a magnetic memory cell. For example, the memory cell is a SOT-MRAM cell. The memory cell is similar to the memory cell 200 described in FIG. 2. Common elements may not be described or described in detail.

The memory cell 300 includes a storage unit 320 and a cell selector unit 340. The storage unit is coupled to the cell selector unit. The storage unit 320, in one embodiment, includes a storage element, such as a MTJ storage element 210.

The top of the MTJ stack is coupled to a read line RL while the bottom of the MTJ stack is coupled to the selector unit. The MTJ stack may include a top electrode (not shown).

The MTJ element is coupled to a spin-orbit-torque (SOT) layer 236. The free layer of the MTJ element is coupled to the SOT layer. The MTJ element, for example, is a top pinned MTJ element which has its free layer disposed on the SOT layer. The SOT layer is disposed between a strain induced layer 238 and the MTJ element. For example, the strain induced layer is disposed below the SOT layer under the MTJ element. The strain induced layer is coupled to a digital line DL. The read line RL is coupled to the MTJ element. For example, the RL is coupled to the fixed layer of the MTJ element. A top electrode (not shown) may be disposed between the MTJ element and the RL. A write line WL is coupled to the SOT layer.

As for the cell selector unit 340, it includes a selector 241. The selector includes a select transistor, such as an n-type MOS transistor. Providing a p-type MOS transistor may also be useful. The select transistor includes first and second source/drain (S/D) terminals 245 and 246 and a gate terminal 244. The first S/D terminal 245 may be referred to as a drain terminal and the second S/D terminal 246 may be referred to as a source terminal. The drain terminal of the selector transistor is coupled to the SOT layer; the source terminal of the select transistor is coupled to a source line SrL of the memory cell while the gate terminal of the select transistor is coupled to a select line SL.

The operating biases for the memory cell 300 is similar to that provided in Table 1 above. As shown, the cell selector unit includes a single selector which is coupled to the SOT and SrL. The read path is from the RL to the SrL through the MTJ element and select transistor while the write path is from the WL to SrL through the SOT layer. Although the MTJ element of the memory cell is a top pinned MTJ stack, it is understood that it may be a bottom pinned MTJ stack. In such case, the SOT layer is disposed on top of the free layer of the bottom pinned MTJ stack and the DL will be disposed on top of the RL. Please note that in either case, the free layer is proximate and coupled to the SOT layer which is disposed adjacent to the strain induced layer and the DL. Furthermore, the magnetization direction may be perpendicular or horizontal.

Figure 4:
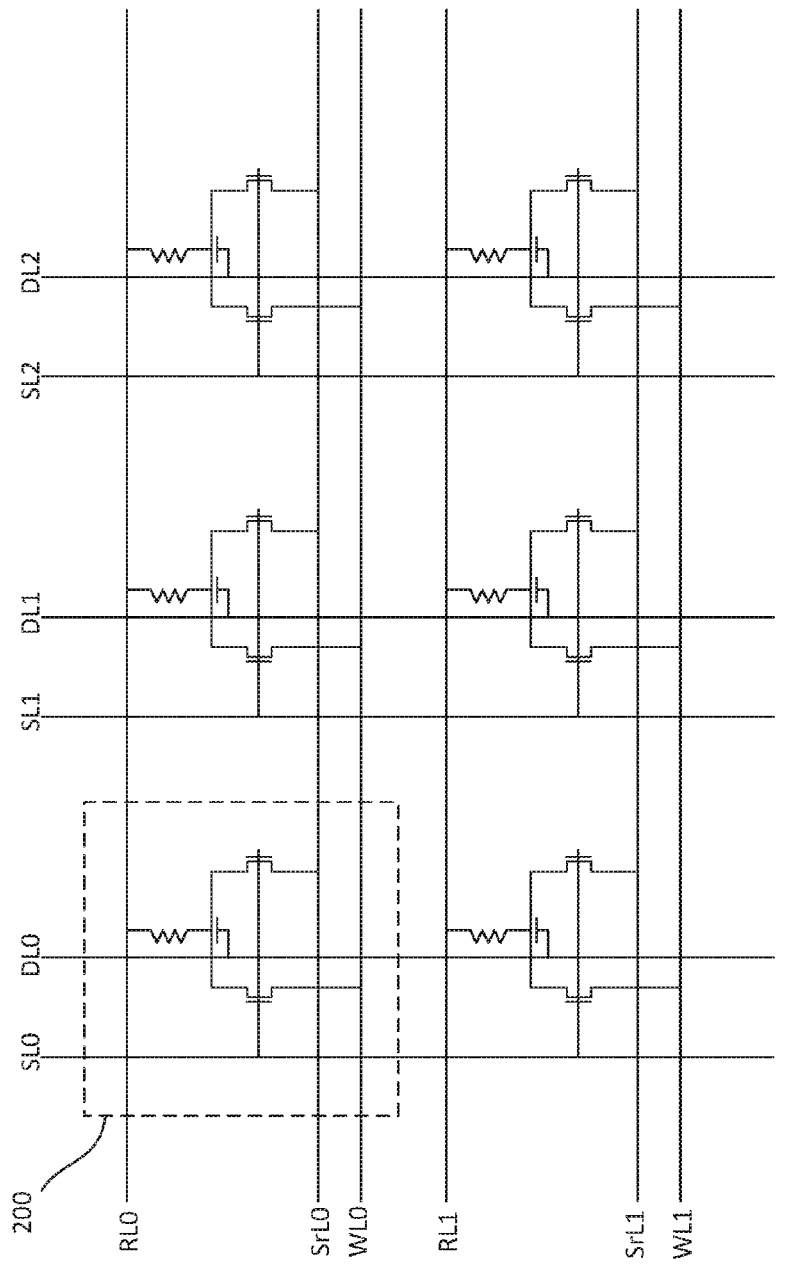
FIGS. 4-5 illustrate various embodiments of a memory array.

FIG. 4 shows a schematic diagram of an embodiment of a memory array 400. The array includes a plurality of interconnected memory cells 200. The memory cells may be similar to the memory cell described in FIG. 2. For example, the memory cells are MRAM cells, such as SOT-MRAM cells. Common elements may not be described or described in detail.

As shown, the array includes six memory cells arranged in a 3×2 array. For example, the array is arranged to form three rows and two columns of memory cells. Memory cells of a row are interconnected by SL and DL (SL0 and DL0; SL1 and DL1; or SL2 and DL2) while memory cells of a column are interconnected by a RL, SrL and WL (RL0, SrL0 and WL0; or RL1, SrL1 and WL1). Other configurations may also be useful.

Figure 5:
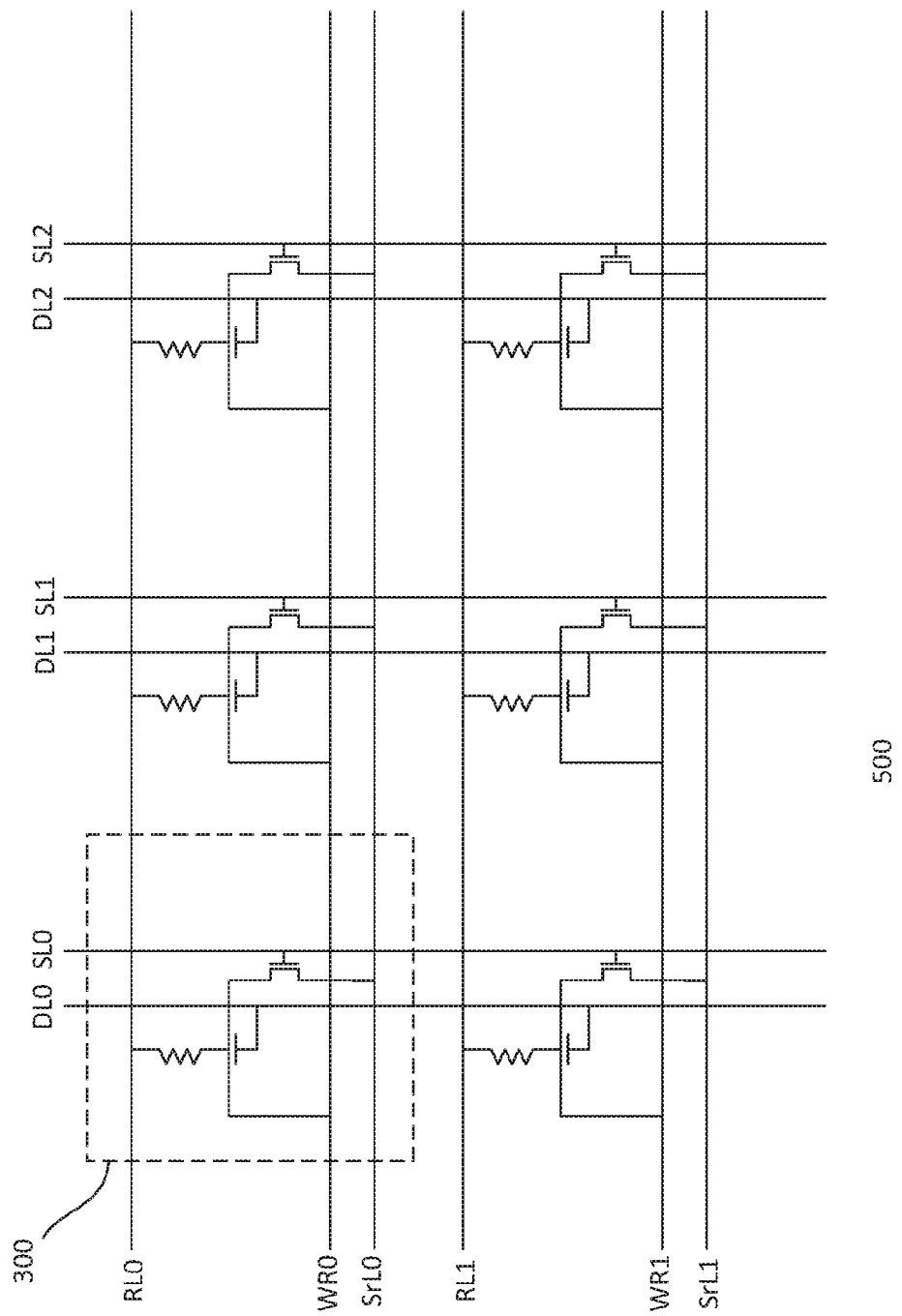

FIG. 5 shows a schematic diagram of another embodiment of a memory array 500. The array includes a plurality of interconnected memory cells 300. The memory cells may be similar to the memory cell described in FIG. 3. For example, the memory cells are MRAM cells, such as SOT-MRAM cells. Common elements may not be described or described in detail.

As shown, the array includes six memory cells arranged in a 3×2 array. For example, the array is arranged to form three rows and two columns of memory cells. Memory cells of a row are interconnected by DL and SL (DL0 and SL0; DL1 and SL1; or DL2 and SL2) while memory cells of a column are interconnected by RL, SrL and WL (RL0, SrL0 and WL0; or RL1, SrL1 and WL1). Other configurations may also be useful.

Figure 6A:
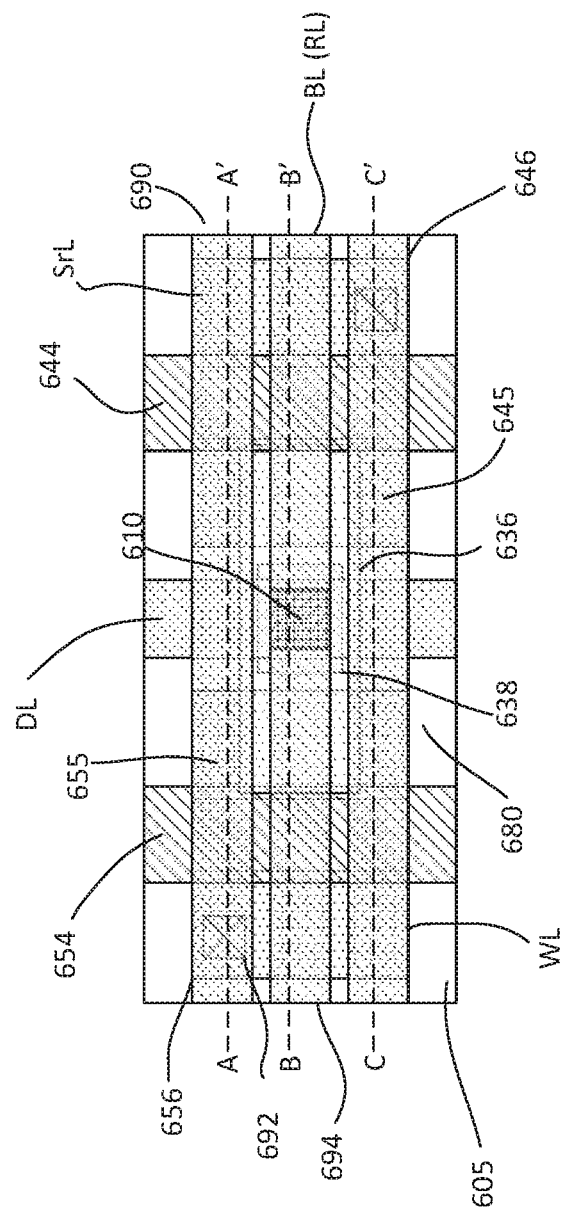
FIGS. 6a-6d show top and various cross-sectional views of an embodiment of a memory cell.
Figure 6B:
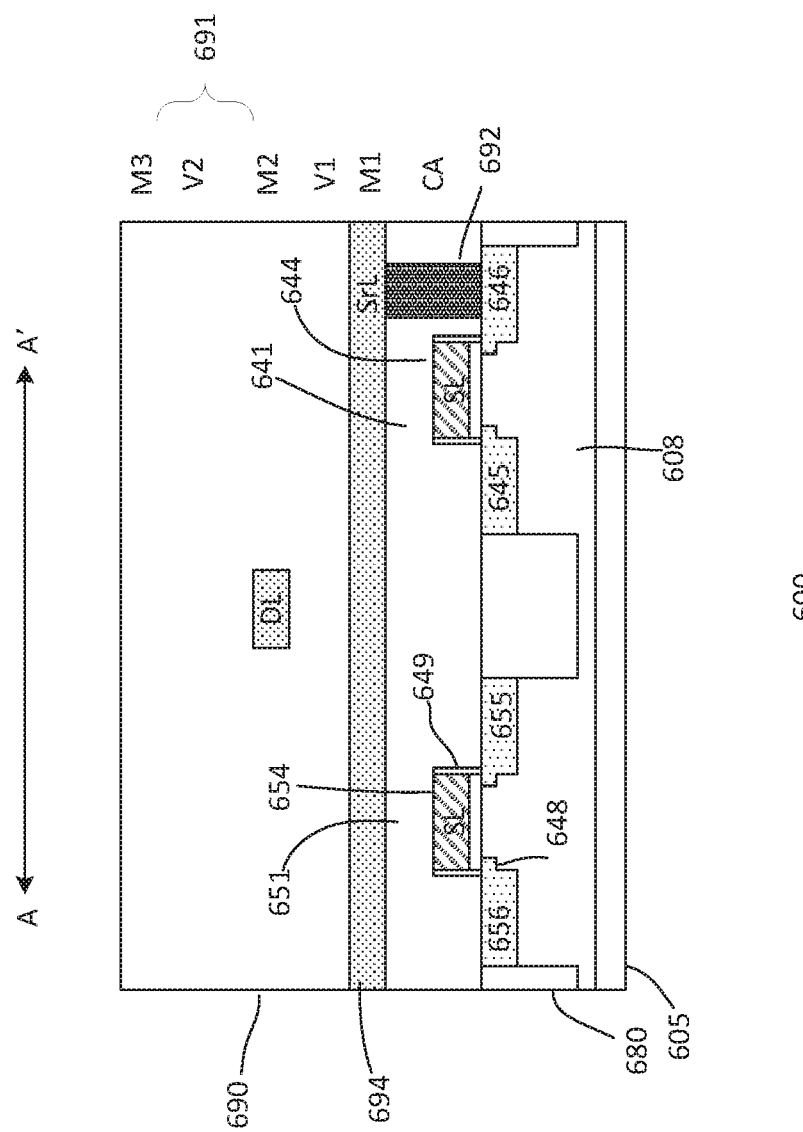
Figure 6C:
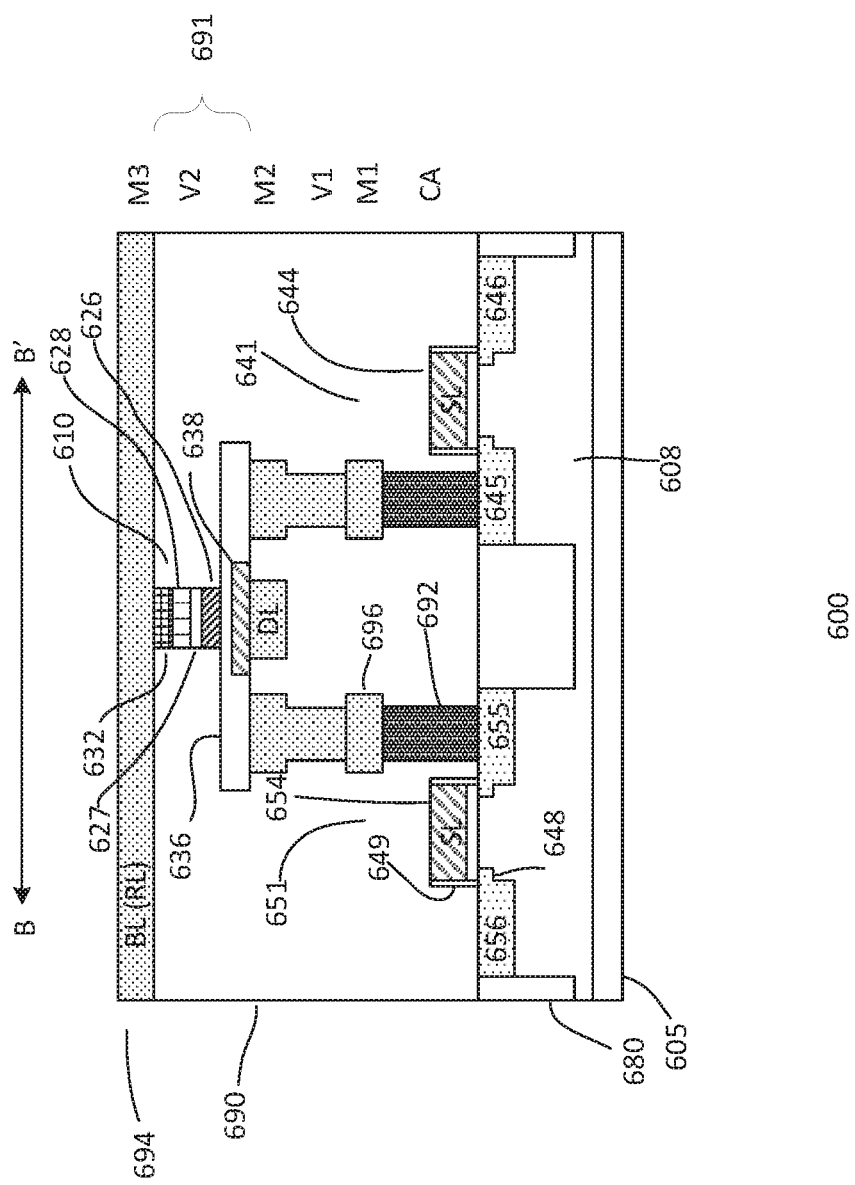
Figure 6D:
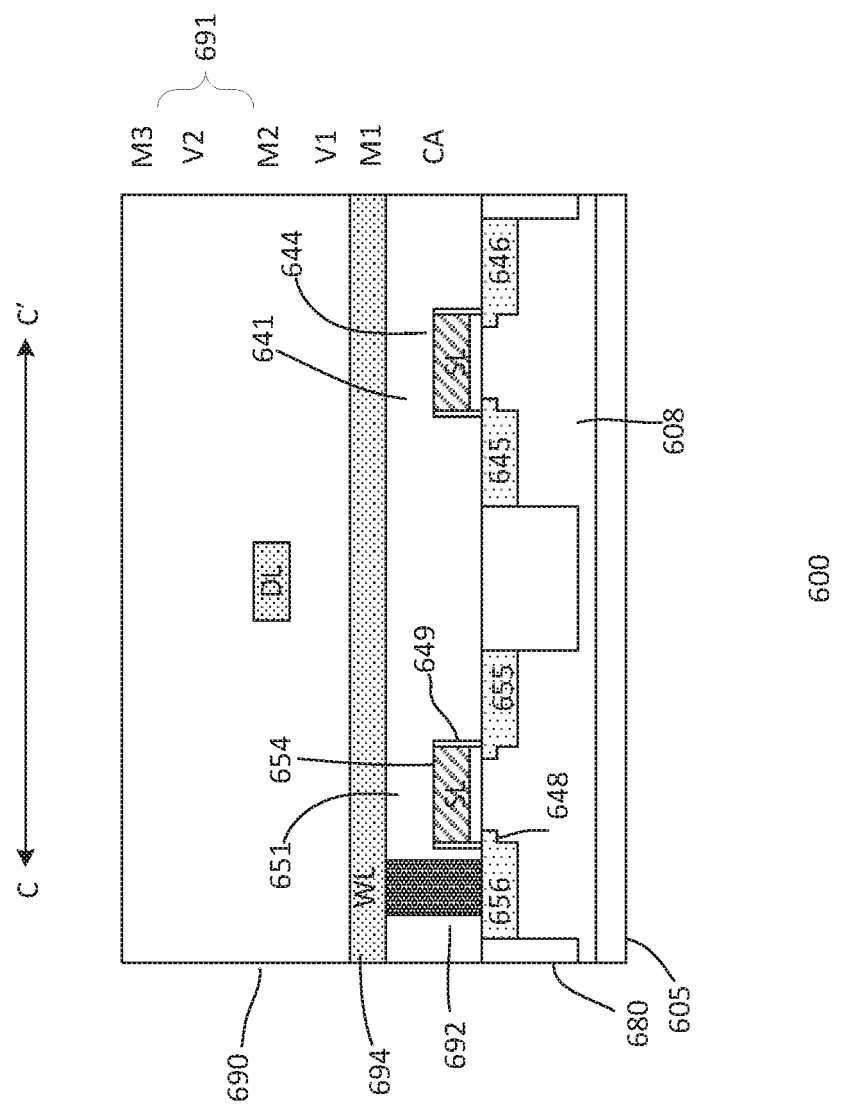

FIG. 6a shows a top view of an embodiment of a device 600 while FIGS. 6b-6d show various cross-sectional views along A-A', B-B' and C-C'. The device, as shown, includes a memory cell. The memory cell, for example, may be a NVM cell. The memory cell, in one embodiment, is a magnetoresistive NVM cell, such as a SOT-MRAM cell. The memory cell, for example, is similar to that described in FIG. 2. Common elements may not be described or described in detail.

The memory cell is disposed on a substrate 605. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. The surface and bulk crystalline layers, for example, are single crystalline silicon. In such case, the COI substrate, for example, is a silicon-on-insulator (SOI) substrate. Other types of dielectric insulating materials and crystalline layers to form other types of COI substrates may also be useful. It is understood that the surface and bulk layers need not be formed of the same material.

Isolation regions 680 may be provided. In one embodiment, the isolation regions are shallow trench isolation (STI) regions. Other types of isolation regions may also be useful. The isolation regions are provided to isolate device regions from other regions. In one embodiment, isolation regions may be provided to isolate memory cells from each other. For example, a memory cell may be formed in a cell region which is isolated from other cell regions by isolation regions. Other suitable configurations of isolation regions may also be useful.

A cell selector unit is provided in the cell region. The cell selector unit includes first and second selectors 641 and 651. The first selector 641, for example, may be a read selector and the second selector 651 is a write selector. The selectors, in one embodiment, include transistors. For example, the first selector includes a first select transistor and the second selector includes a second select transistor. The transistors of the selectors may be metal oxide semiconductor (MOS) transistors. In one embodiment, the MOS transistors are n-type MOS transistors. Other types of cell selectors may also be useful.

The cell region includes a device well or body well 608 which serves as a body of the transistors. For example, the cell region includes a body or device well for transistors of the selectors. The device well may be a continuous well for the entire memory array. The body well may be doped with second polarity type dopants for first polarity type select transistors. The body well, in one embodiment, is a p-type doped well for n-type transistors. The device well may be lightly or intermediately doped with second polarity type dopants. For example, the device well may have a dopant concentration of about 1E16 to 1E19/cm$^3$. Other suitable dopant concentrations may also be useful.

A transistor, as shown, includes first and second source/drain (S/D) regions and a gate disposed on the substrate between the S/D regions. For example, the first select transistor includes first and second S/D regions 645 and 646 with a gate 644 disposed on the substrate between them while the second select transistor include first and second S/D regions 655 and 656 with a gate 654 disposed on the substrate between them. The first S/D regions may be referred to as drain regions while the second S/D regions may be referred to as source regions. As shown, the drain regions of the select transistors are separated from each other by an isolation region.

A gate of a transistor, for example, may include a gate electrode over a gate dielectric. The gate electrode may be polysilicon while the gate dielectric may be silicon oxide. Other suitable types of gate electrode and gate dielectric materials may also be useful. For example, a gate may be a metal gate with a metal gate electrode and a high k gate dielectric. A gate, for example, may be a gate conductor along a first or select line (SL) direction. The gate conductor forms a common gate for a row of memory cells. A gate conductor may serve as a select line SL.

As for the S/D regions, they are heavily doped regions with first polarity type dopants. For example, the S/D regions are heavily doped n-type regions for forming n-type transistors. Providing S/D regions with p-type dopants for p-type transistors may also be useful. The S/D regions may include lightly doped (LD) extension regions 648. The gate may include dielectric sidewall spacers 649. The spacers, for example, facilitate in forming the lightly doped (LD) extension regions and heavily doped S/D regions. The LD extension regions, for example, are lightly doped regions extending slightly under the gate. Halo regions (not shown) may be provided for the S/D regions. The halo regions are second polarity type doped regions which extend beyond the LD extension regions.

Disposed over the transistors is a dielectric layer 690. The dielectric layer serves as a backend dielectric layer. The backend dielectric layer may include one or more interlevel dielectric (ILD) layers. An ILD layer includes a metal level and a contact level. The metal level includes conductors or metal lines while the contact level includes contacts. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. As shown, the dielectric layer includes ILD levels up to M3. The dielectric layer may include additional ILD levels (not shown). The number of levels may depend on design requirements. For example, the dielectric layer may include 6 ILD levels. For example, the dielectric layer may include up to M6. Other suitable number of ILD levels may also be useful.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors or metal lines in M1 may be formed of copper or copper alloy. For upper ILD levels, metal lines and contacts may be formed by dual damascene techniques. Dual damascene processes may employ copper or copper alloys for contacts and conductive lines. Other configurations or techniques for forming lines and contacts of the ILD levels may also be useful.

A dielectric liner may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

As shown, contacts 692 are disposed in the CA level of the backend dielectric layer. The contacts, for example, are in communication with contact regions on the substrate. For example, the contacts may be coupled to S/D regions and gates. Conductive lines 694 are disposed in the first metal or M1 level above the CA level.

In one embodiment, WL (along C-C') and SrL (along A-A') are provided in M1. The WL is coupled to the source region of the second select transistor and the SrL is coupled to the source region of the first select transistor. The WL and SrL are connected to the source regions via contacts 692 in the CA level. The WL and SrL are perpendicular to the direction of the gates or SLs. As shown, the WL and SrL are offset in M1 to enable the lines to be on the same level. For example, the WL and SrL are coupled to contacts located at opposite ends along the width direction of the S/D regions.

In addition, interconnect pads 696 (along B-B') are disposed in M1. An interconnect pad is coupled to a drain region of a transistor by a contact 692 in CA. For example, first and second interconnect pads are provided which are coupled to the drain regions of the first and second select transistors through contacts 692.

In one embodiment, interconnect pads and contacts are provided in M2 and V1, which are coupled to interconnect pads on M1. As discussed, the contacts and interconnect pads may be formed using a dual damascene technique. Disposed between the pads in M2 is a DL. The DL is parallel to the gates or SLs or perpendicular to the WL and SrL. The DL extends, for example, across a row of memory cells. For example, the DL serves as a common DL for a row of memory cells.

A storage dielectric layer 691 is disposed in the dielectric layer 690. The storage dielectric layer, for example, is part of the V2 level. Providing the storage dielectric layer in other levels may also be useful. A SOT layer 636 is disposed in the storage dielectric layer. The SOT layer is disposed over the metal layer below. For example, the SOT layer is disposed over M2. The SOT layer is in electrical communication with the drain regions of the select transistors. For example, the SOT layer is in contact with the interconnect pad in M2. The SOT layer includes Ta, Pt, Co/Pt, W or other suitable types of heavy metals. Other suitable types of materials, which include any topological insulators of which Spin Hall angle is large to provide more spin orbit torque, may also be used as the SOT layer. The thickness of the SOT layer may be about 2-10 nm or more. Other suitable thickness may also be useful. The footprint of the SOT layer should be sufficient to accommodate a storage element 610.

A strain induced layer 638 is disposed in the storage dielectric layer below the SOT layer. The strain induced layer is electrically coupled to the DL. The strain induced layer is disposed within the footprint of SOT layer and may have a footprint which is larger than the footprint of the storage element. As shown, a width of the strain induced layer along B-B' is wider than DL. For example, the storage element 610 is disposed above and within the width of the strain induced layer. Other suitable configuration for the strain induced layer may also be useful. In one embodiment, the strain induced layer includes a strain induced material. Various types of strain induced material may also be useful. For example, the strain induced material may include a piezo electric or a ferroelectric material, such as aluminum nitride (AlN), lead zirconate (PZT), $BaTiO_3$ or $BiFeO_3$. Other types of strain induced materials may also be useful. The thickness of the strain induced layer may be about, for example, 2-20 nm. Other suitable thicknesses may also be useful.

The storage element 610 is disposed over the SOT layer in the storage dielectric layer. In one embodiment, the storage element is a MTJ element, for example, as described in FIGS. 1a-1b. The MTJ element includes a tunneling barrier layer 627 between a fixed magnetic layer 628 and a free magnetic layer 626. The tunneling barrier layer may be MgO while the free and fixed layers may be CoFeB or CoFe based composite material. Other types of tunneling and magnetic layers may also be useful. The free layer 626 is disposed proximate to the SOT layer 636. For example, the free layer is disposed on the SOT layer while the fixed layer 628 is disposed distal from the SOT layer. This, for example, produces a top pinned MTJ element. The MTJ element may have horizontal magnetization directions. Providing vertical magnetization directions may also be useful. The MTJ element may include a top electrode 632. The electrode, for example, may be a Ta or TaN electrode. Other types or configurations of MTJ elements, including other types of layers or materials may also be useful.

Above the storage dielectric layer 691 is a metal level of an ILD level. For example, the metal level is M3. Other metal levels may also be useful. The metal level includes metal lines disposed in a dielectric layer. The metal lines and top of the dielectric layer have coplanar top surfaces. In one embodiment, a read line RL is provided in the metal level above the storage dielectric layer and is coupled to the storage element.

Although as described, the various lines and storage element are disposed in specified dielectric levels of the backend dielectric layer, other configurations may also be useful. For example, they may be disposed in other or additional ILD levels. For example, the storage element may be provided in via level of other metal levels, such as between M3 and M4 or other suitable upper metal levels. In some embodiments, the MTJ element may be a bottom pinned element. In such cases, the MTJ element is disposed beneath the SOT layer, with the strain induced layer and DL above. Furthermore, the device may include other device regions and components.

Figure 7A:
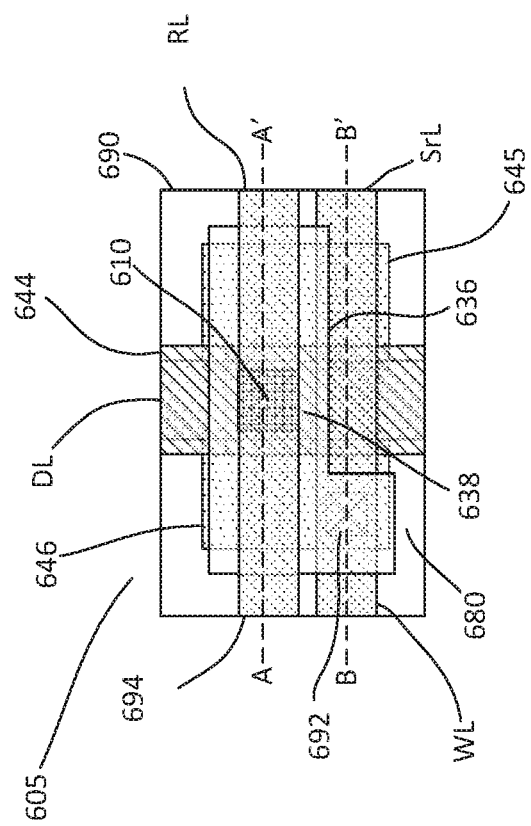
FIGS. 7a-7c show top and various cross-sectional views of another embodiment of a memory cell.
Figure 7B:
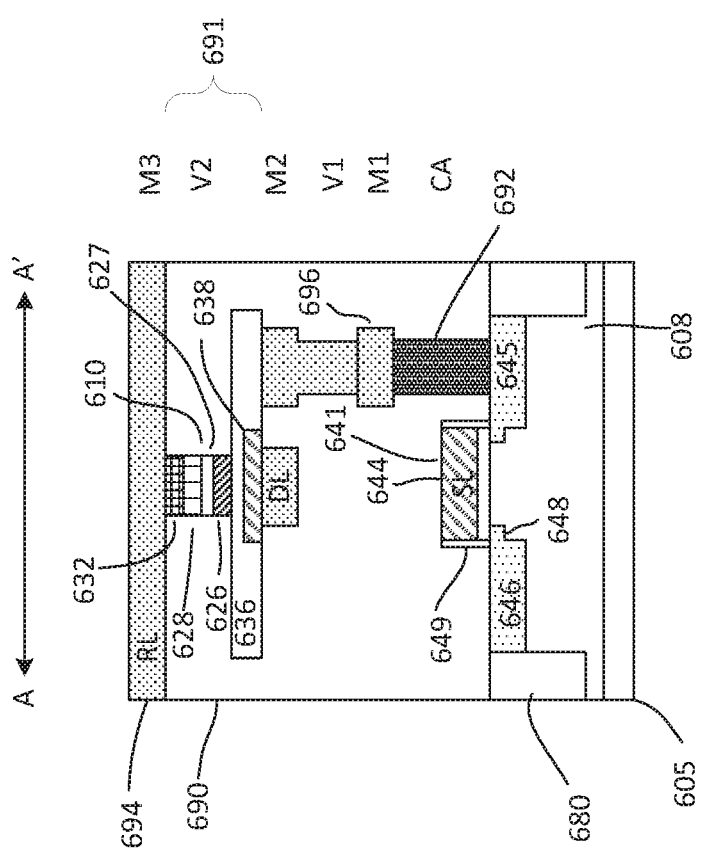
Figure 7C:
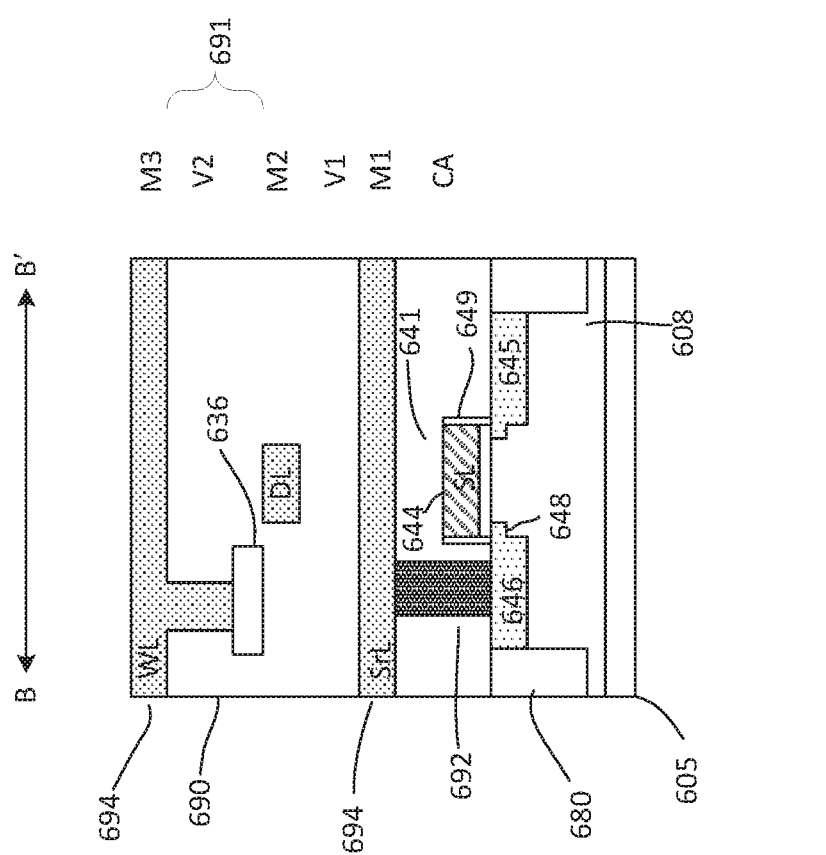

FIG. 7a shows a top view of another embodiment of a device 700 while FIGS. 7b-7c show various cross-sectional views along A-A' and B-B'. The device, as shown, includes a memory cell. The memory cell, for example, may be a NVM cell. The memory cell, in one embodiment, is a magnetoresistive NVM cell, such as a SOT-MRAM cell. The memory cell, for example, is similar to that described in FIG. 3 and FIGS. 6a-6d. Common elements may not be described or described in detail.

The memory cell is disposed on a substrate 605. For example, the memory cell is disposed in a cell region of the substrate. The cell region may be part of an array region. For example, the array region may include a plurality of cell regions. The substrate may include other types of device regions (not shown). The substrate, for example, is a semiconductor substrate, such as a silicon substrate. Other types of substrates, such as a COI substrate may also be useful.

Isolation regions 680, such as STI regions, may be provided. The isolation regions are provided to isolate device regions from other regions. In one embodiment, isolation regions may be provided to isolate memory cells from each other. For example, a memory cell may be formed in a cell region which is isolated from other cell regions by isolation regions. Other suitable configurations of isolation regions may also be useful.

A cell selector unit is provided in the cell region. The cell selector unit includes a selector 641. The selector, for example, is used to select the memory cell. The selector, in one embodiment, includes a transistor. The transistor of the selector may be a metal oxide semiconductor (MOS) transistor. In one embodiment, the MOS transistors are n-type MOS transistors. Other types of cell selectors may also be useful.

The cell region includes a device well or body well 608 which serves as a body of the transistor. For example, the cell region includes a body or device well for transistor of the selector. The device well may be a continuous well for the entire memory array. The body well may be doped with second polarity type dopants for first polarity type select transistors.

A transistor, as shown, includes first and second source/drain (S/D) regions 645 and 646 and a gate 644 disposed on the substrate between the S/D regions. The first S/D region may be referred to as a drain region while the second S/D region may be referred to as a source region.

As for a S/D region, it is a heavily doped region with first polarity type dopants. The S/D region may include a lightly doped (LD) extension region 648. The gate may include dielectric sidewall spacers 649. The spacers, for example, facilitate in forming the lightly doped (LD) extension regions and heavily doped S/D regions. A halo region (not shown) may be provided for a S/D region.

Disposed over the transistors is a dielectric layer 690. The dielectric layer serves as a backend dielectric layer. The backend dielectric layer may include one or more interlevel dielectric (ILD) layers. As shown, the dielectric layer includes ILD levels up to M3. The dielectric layer may include additional ILD levels (not shown). The number of levels may depend on design requirements.

As shown, contacts 692 are disposed in the CA level of the backend dielectric layer. The contacts, for example, are in communication with contact regions on the substrate. For example, the contacts may be coupled to S/D regions and gate. Conductive lines 694 are disposed in the first metal or M1 level above the CA level. In one embodiment, a SrL (along B-B') is provided in M1. The SrL is coupled to the source region of the select transistor. The SrL is connected to the source region via a contact 692 in the CA level. The SrL is perpendicular to the direction of the gate. In addition, an interconnect pad 696 (along A-A') is disposed in M1. The interconnect pad is coupled to the drain region of the transistor by a contact 692 in CA. As shown, the SrL is offset from the interconnect pad coupled to the drain.

In one embodiment, an interconnect pad and contact are provided in M2 and V1, which are coupled to the interconnect pad in M1. As discussed, the contact and interconnect pad may be formed using a dual damascene technique. The DL is disposed in M2. The DL is parallel to the gate or perpendicular to the SrL. The DL extends, for example, across a row of memory cells. For example, the DL serves as a common DL for a row of memory cells.

A storage dielectric layer 691 is disposed in the dielectric layer 690. The storage dielectric layer, for example, is part of the V2 level. Providing the storage dielectric layer in other levels may also be useful. A SOT layer 636 is disposed in the storage dielectric layer. A strain induced layer 638 is disposed in the storage dielectric layer between the SOT layer and DL.

A storage element 610 is disposed over the SOT layer in the storage dielectric layer. In one embodiment, the storage element is a MTJ element, for example, as described in FIGS. 1a-1b. The MTJ element may include a top electrode 632. Other types or configurations of MTJ elements, including other types of layers or materials may also be useful.

Above the storage dielectric layer is a metal level of an ILD level. For example, the metal level is M3. Other metal levels may also be useful. The metal level includes metal lines disposed in a dielectric layer. The metal lines and top of the dielectric layer have coplanar top surfaces. In one embodiment, a read line RL (along A-A') and a write line WL (along B-B') are provided in a metal level above the storage dielectric layer 691 and the RL is coupled to the storage element 610. The WL is coupled to the SOT layer 636 by a contact. The WL and contact may be formed by, for example, a dual damascene technique. The WL and RL are parallel to each other and are perpendicular to the gate. The WL and RL are offset. For example, the SOT layer is L shaped to offset the WL and RL.

Although as described, the various lines and storage element are disposed in specified dielectric levels of the backend dielectric layer, other configurations may also be useful. For example, they may be disposed in other or additional ILD levels. For example, the storage element may be provided in via level of upper metal levels, such as between M3 and M4 or other suitable upper metal levels. In some embodiments, the MTJ element may be a bottom pinned element. In such cases, the MTJ element is disposed beneath the SOT layer, with the strain induced layer and DL above. Furthermore, the device may include other device regions and components.

Figure 8B:
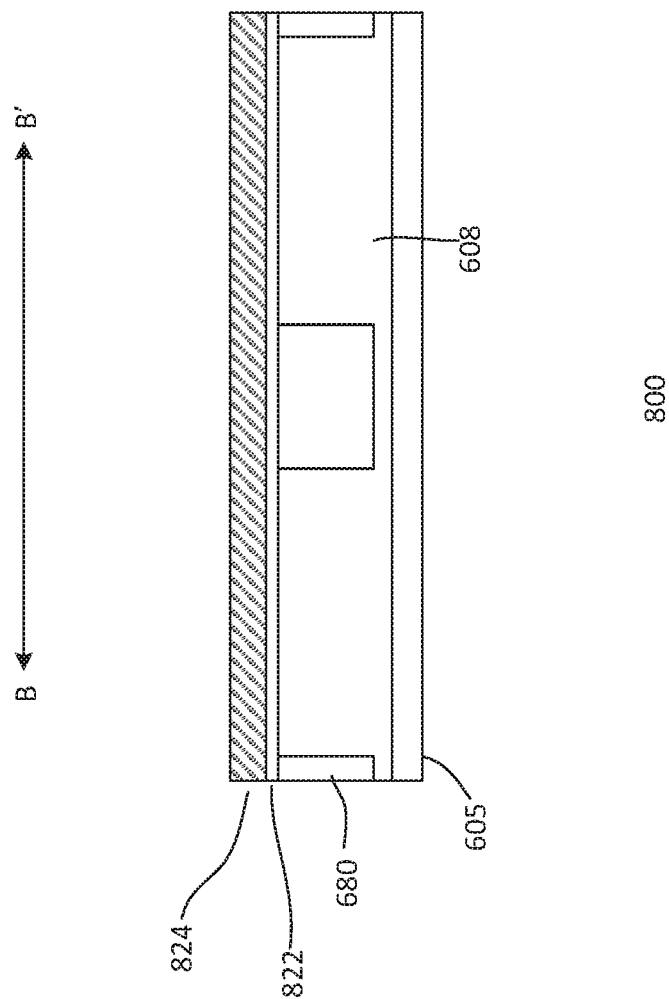
FIGS. 8a-8o show cross-sectional views of an embodiment of a process for forming a device with a memory cell.
Figure 8G:
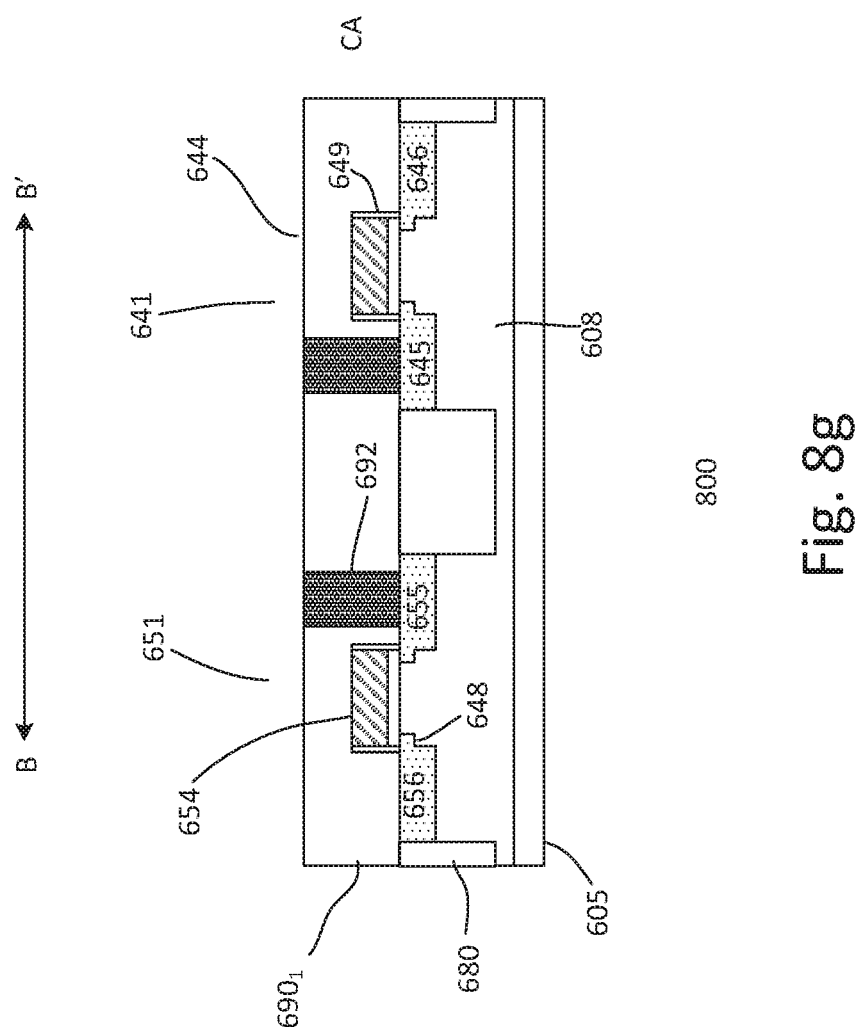
Figure 8H:
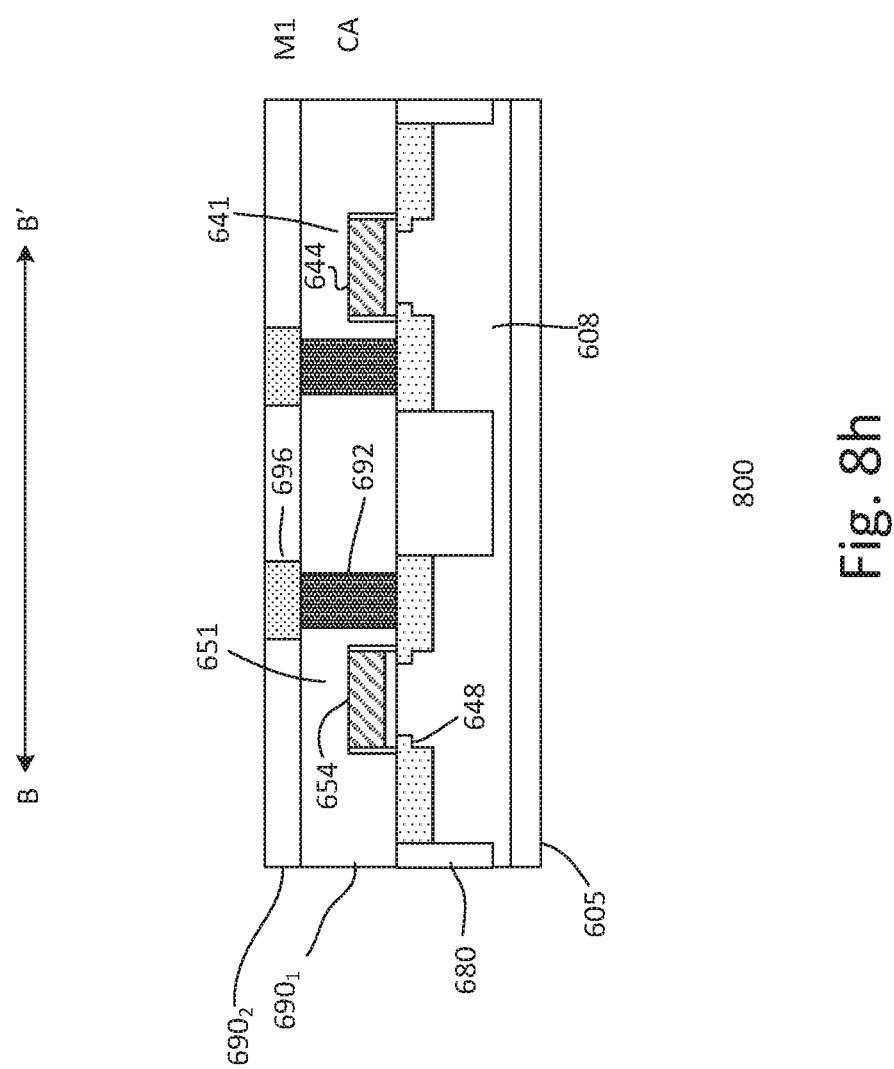
Figure 8I:
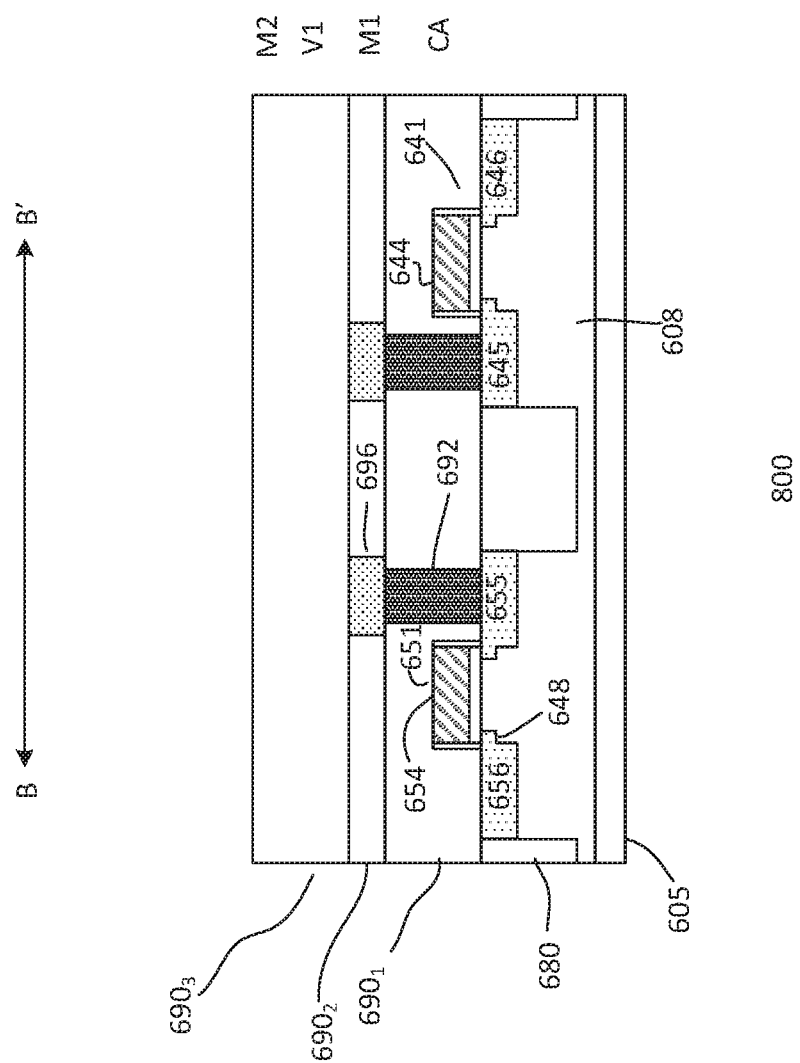
Figure 8J:
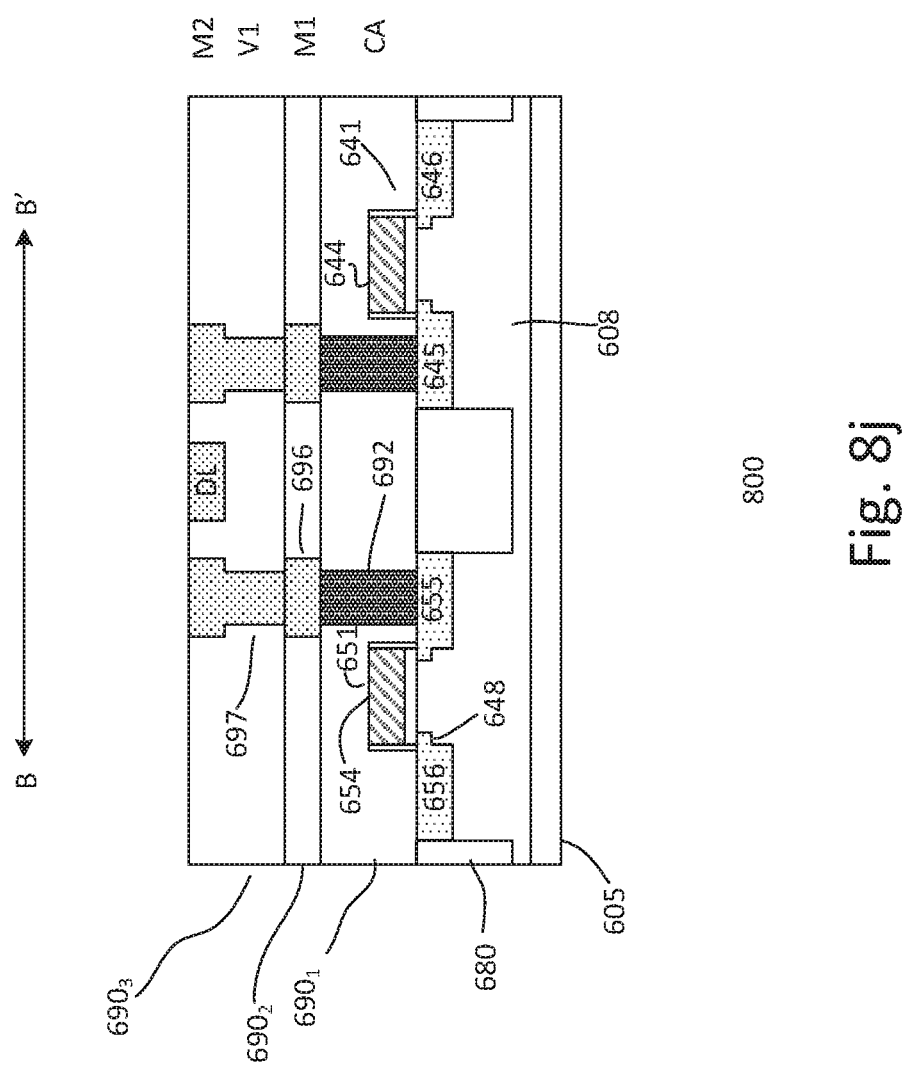
Figure 8K:
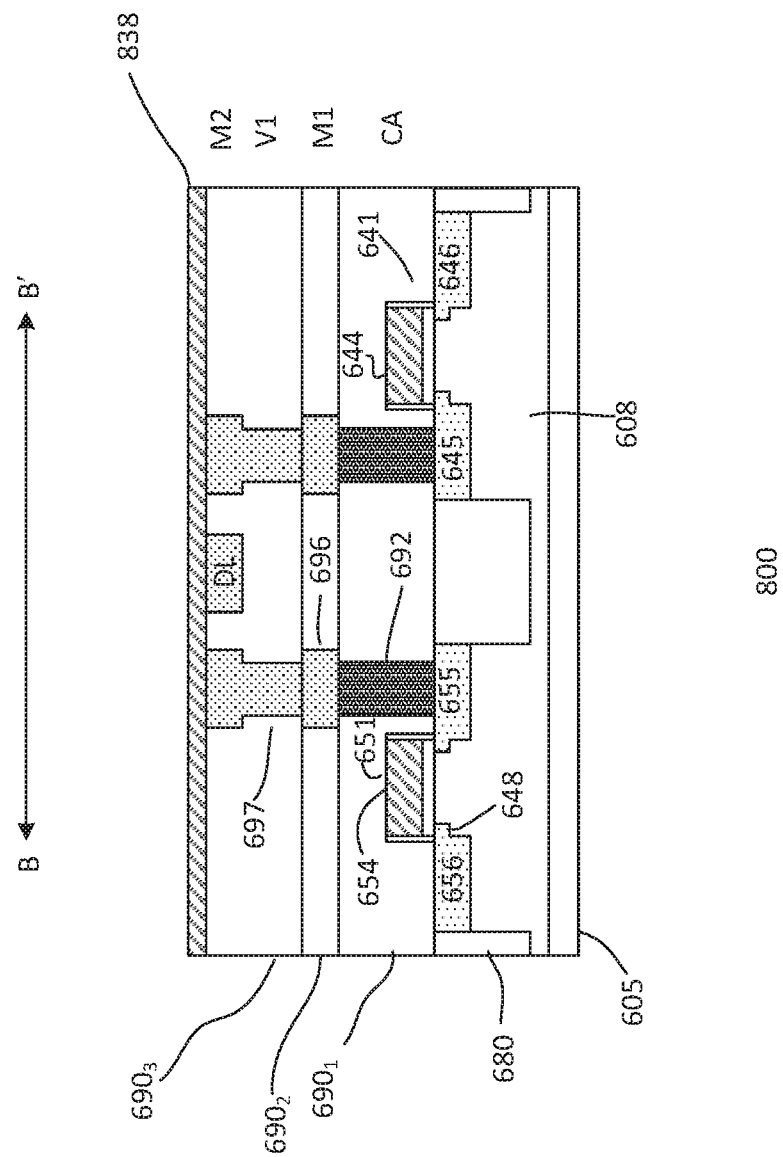
Figure 8I:
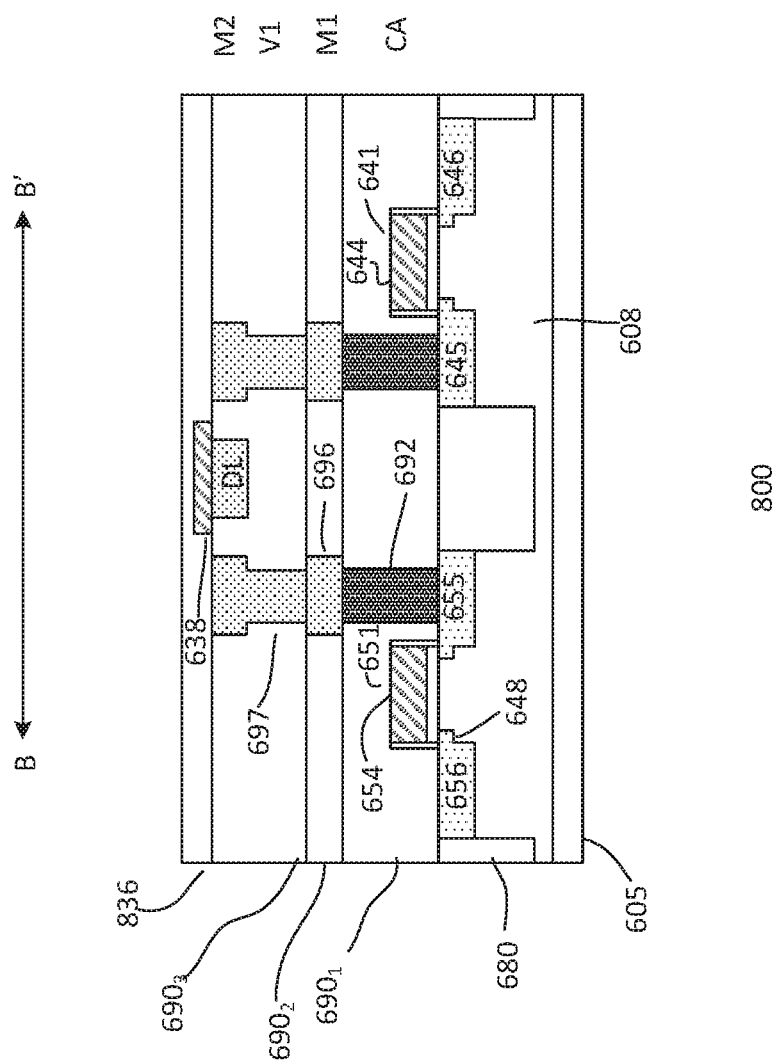
Figure 8M:
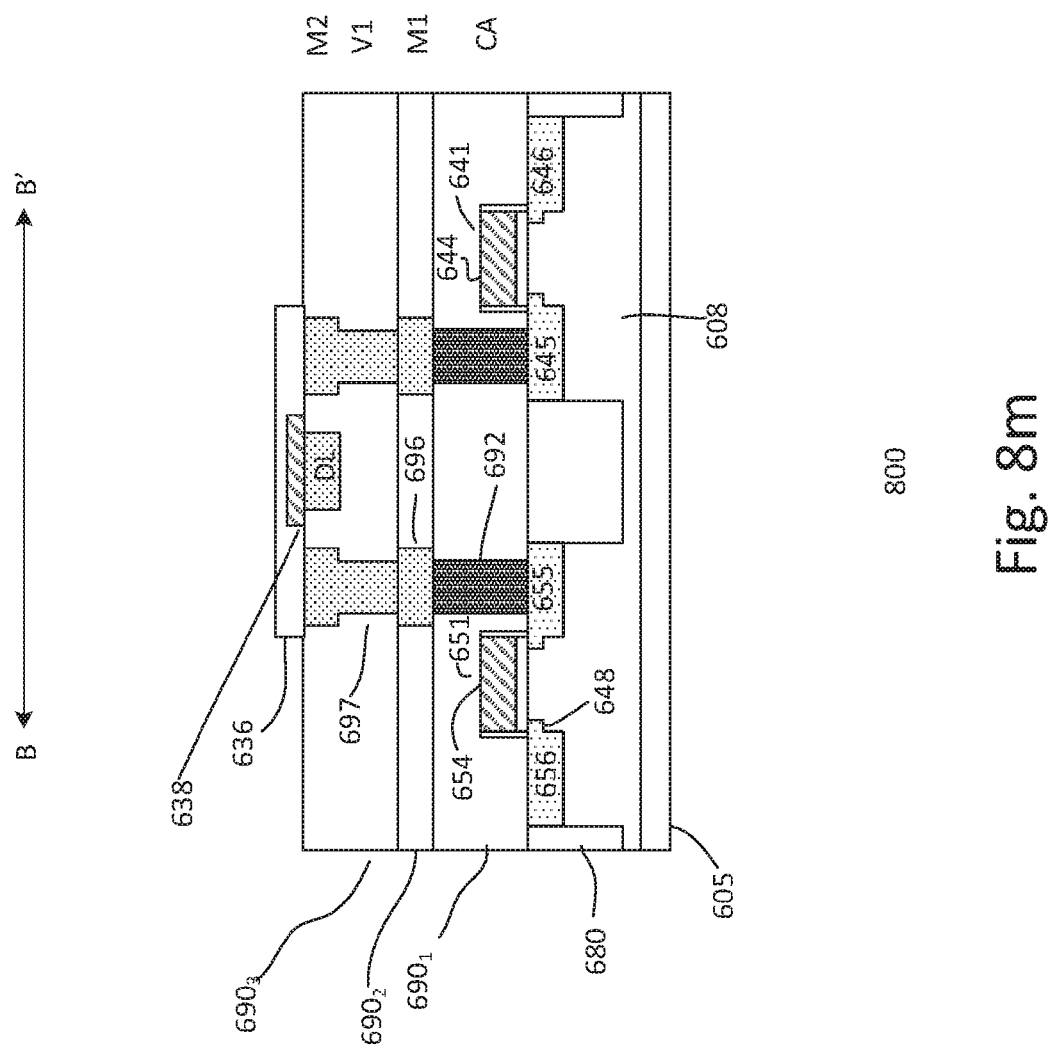
Figure 8N:
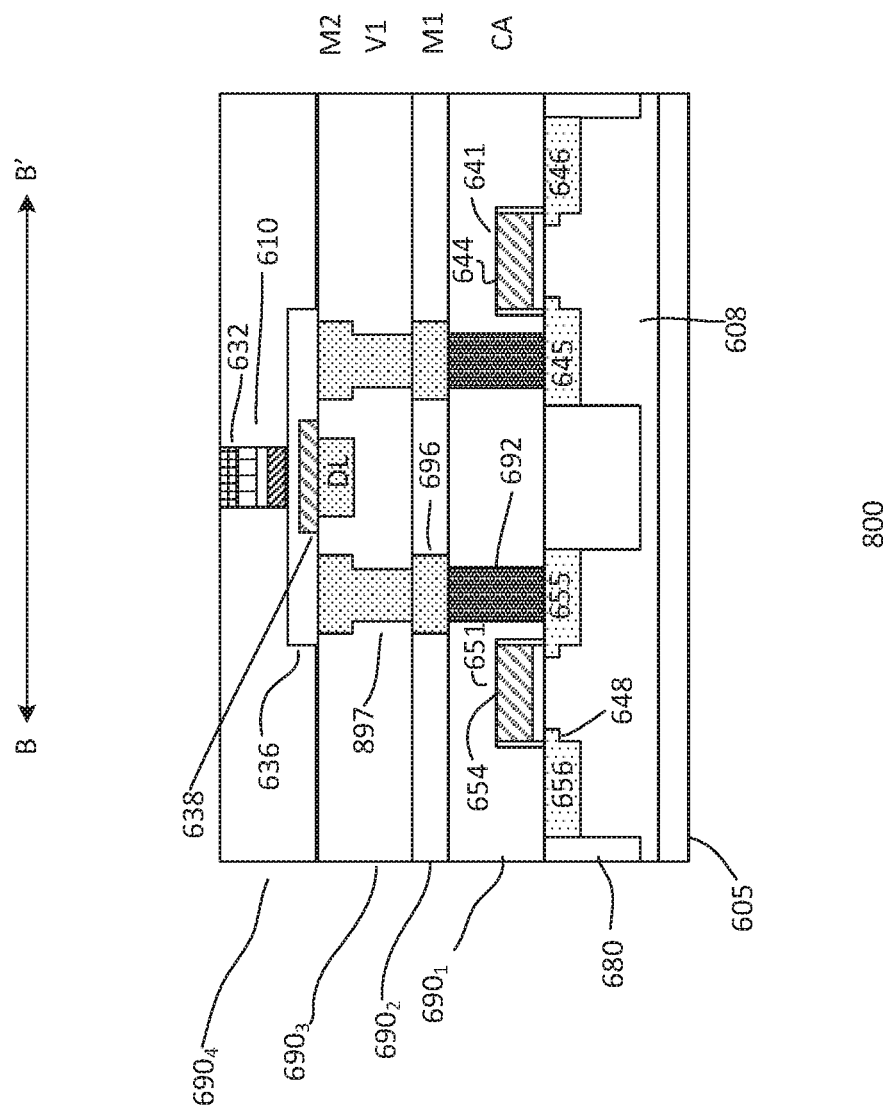
Figure 8O:
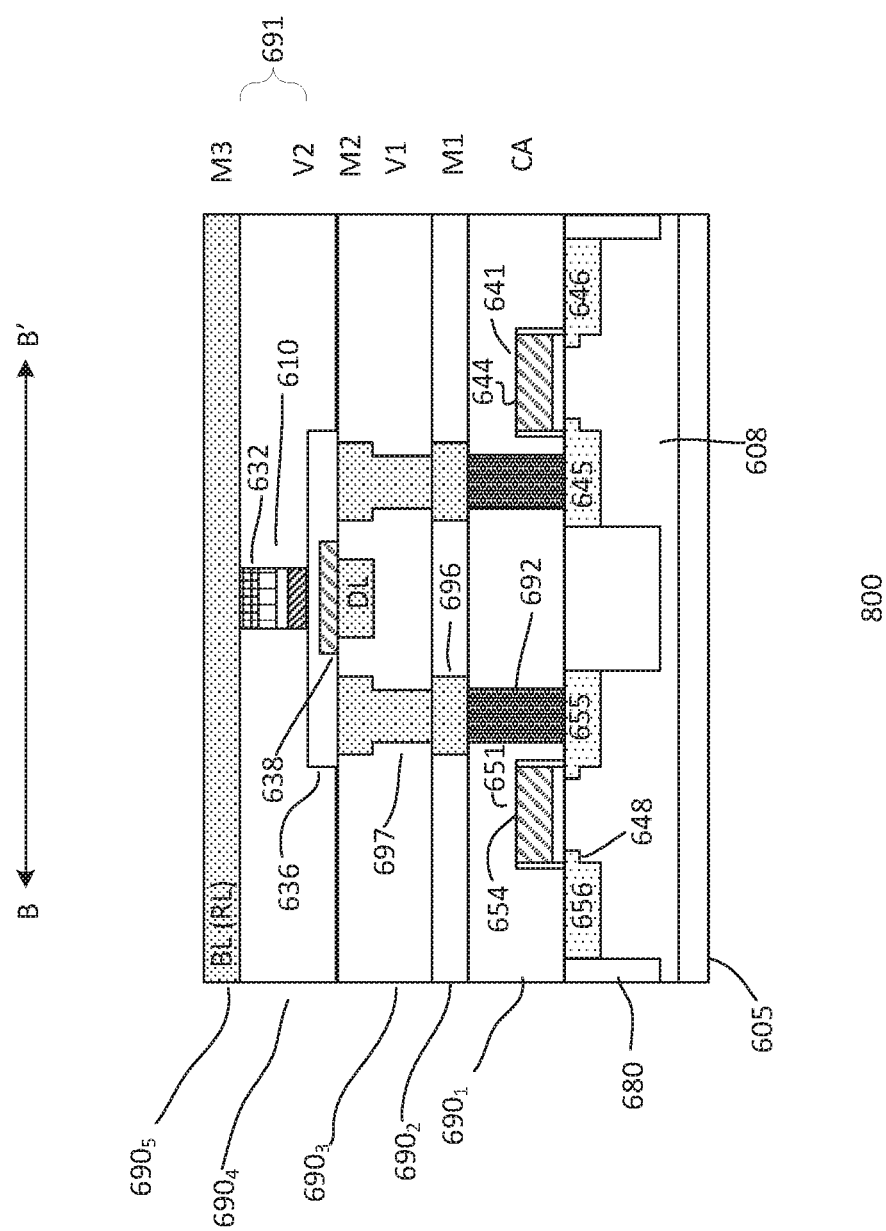

FIGS. 8a-8o show cross-sectional views of an embodiment of a process 800 for forming a device. The process 800 includes forming a memory cell. The memory cell, for example, may be a NVM cell. The memory cell, in one embodiment, is a magnetoresistive NVM cell, such as a SOT-MRAM cell. The memory cell, for example, is the same or similar to that described in FIGS. 6a-6d. Common elements may not be described or described in detail.

The cross-sectional views, for example, are taken along B-B' as shown in FIG. 6a. Although the cross-sectional views show one memory cell, it is understood that the device includes a plurality of memory cells of, for example, a memory array. In one embodiment, the process of forming the SOT-MRAM cell is highly compatible with CMOS logic process. For example, the SOT-MRAM cell can be formed simultaneously with CMOS logic devices (not shown) on the same substrate.

Referring to FIG. 8a, a substrate 605 is provided. The substrate, for example, is a semiconductor substrate, such as a silicon substrate. For example, the substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

In FIG. 8a, the substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 680 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

Referring to FIG. 8a, a device well or a body well 608 is formed. The well, for example, serves as a body of select transistors of the memory cell. In one embodiment, second polarity type dopants are implanted into the substrate to form the device well. The second polarity type dopants, for example, include p-type dopants. In one embodiment, an implant mask may be employed to implant the dopants to form the device well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E16 to 1E19/cm$^3$. Other dopant concentrations may also be useful.

As shown in FIG. 8b, gate layers are formed on the substrate. The gate layers, in one embodiment, include a gate dielectric layer 822 and a gate electrode layer 824 thereover. The gate dielectric layer, for example, may be a silicon oxide layer formed by, thermal oxidation. As for the gate electrode layer, it may be a polysilicon layer formed by chemical vapor deposition (CVD). Other suitable types of gate layers, including high k dielectric and metal gate electrode layers, or other suitable techniques for forming gate layers may also be useful.

Referring to FIG. 8c, the gate layers are patterned to form gates 644 and 654 of the first and second select transistors 641 and 651. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating (ARC) may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gates of the select transistors. The gates, for example, may be gate conductors along a first or select line (or word line) direction. A gate conductor forms a common gate for a row of memory cells. A gate conductor may serve as a select line SL.

Referring to FIG. 8d, an implant is performed to form LD extension regions 648. An implant mask (not shown) may be used to form the LD extension regions. To form the LD extension regions, first polarity type dopants are implanted into the substrate. The first polarity type dopants, for example, include n-type dopants. In one embodiment, the implant forms LD extension regions in the substrate adjacent to the gates. For example, the LD extension regions extend slightly under the gates. The LD extension regions, for example, include suitable dopant concentration of first polarity type dopants.

The process 800 continues to form sidewall spacers on sidewalls of the gates 644 and 654. To form the spacers, a dielectric spacer layer 849, such as silicon oxide, is formed on the substrate covering the gates as shown in FIG. 8e. The spacer layer may be formed by CVD. Other techniques for forming the spacer layer may also be useful. An anisotropic etch, such as RIE, is performed to remove horizontal portions of the spacer layer, leaving spacers 649 to abut the sidewalls of the gates.

Referring to FIG. 8f, an implant is performed to form first and second S/D regions of the first and second select transistors. An implant mask (not shown) may be used to form the first and second S/D regions in the substrate. In one embodiment, the implant forms heavily doped first polarity type S/D regions in the substrate adjacent to the gates. As shown, the implant forms first and second S/D regions 645 and 646 adjacent to the gate 644 of the first select transistor 641 and first and second S/D regions 655 and 656 adjacent to the gate 654 of the second select transistor 651. The first S/D regions may be referred to as drain regions while the second S/D regions may be referred to as source regions. As shown, the drain regions of the select transistors are separated from each other by an isolation region. The first polarity type dopants, for example, include n-type dopants. The implantation process to form the first and second S/D regions may be performed together while forming first polarity type S/D regions in other device regions (not shown) on the same substrate. The first and second heavily doped S/D regions, for example, have a depth deeper than the LD extension regions. The first and second S/D regions, for example, include suitable dopant concentration which is greater than dopant concentration of the LD extension regions.

A dielectric etch stop liner (not shown) may be formed over the transistors 641 and 651. The etch stop liner, for example, is a nitride etch stop liner. Other types of dielectric etch stop liners may also be useful. The etch stop liner serves as an etch stop for subsequent processes, such as contacts formation.

Referring to FIG. 8g, a dielectric layer $690_1$ is formed on the substrate, covering the transistors. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts 692 are formed in the dielectric layer $690_1$ as shown in FIG. 8g. The contacts, for example, connect to contact regions, such as S/D regions and gates of the transistors. Forming the contacts may include forming contact vias in the dielectric layer to expose the contact regions. As shown in FIG. 8g, the contacts 692 are coupled to the drain regions 645 and 655 of the transistors while contacts coupled to source regions 646 and 656 of the transistors are not shown. Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

In FIG. 8h, a dielectric layer $690_2$ is formed over the substrate, covering the lower dielectric layer $690_1$. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Metal lines or interconnect pads 696 are formed in the dielectric layer $690_2$. The metal lines or interconnect pads may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, forming the metal lines include forming a source line SrL and a write line WL. For example, the SrL (not shown) is formed to connect to the source region 646 of the first select transistor and the WL (not shown) is formed to connect the source region 656 of the second select transistor while other interconnects, such as interconnect pads 696 formed in M1 are coupled to the drain regions 645 and 655 of the transistors.

In FIG. 8i, a dielectric layer $690_3$ is formed over the substrate, covering the lower dielectric layer $690_2$. The dielectric layer, for example, serves as contact and metal levels of an ILD layer. In one embodiment, the dielectric layer serves as V1 and M2 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Referring to FIG. 8j, interconnect pads and contacts 697 are formed in the dielectric layer $690_3$. The contacts are formed in V1 while interconnect pads are formed in M2, which are coupled to interconnect pads 696 on M1. The contacts 697 and interconnect pads may be formed using a dual damascene technique. A metal line is also formed in the dielectric layer $690_3$ in between the interconnect pads. The metal line serves as a digital line DL and is formed in a parallel direction with the gates or SLs or in perpendicular direction with the WL and SrL. The DL extends, for example, across a row of memory cells. For example, the DL serves as a common DL for a row of memory cells.

The process 800 continues to form a strain induced layer 838 over the dielectric layer $690_3$ as shown in FIG. 8k. The strain induced layer is electrically coupled to the DL. In one embodiment, the strain induced layer includes a strain induced material. Various types of strain induced material may also be useful. For example, the strain induced material may include a piezo electric or a ferroelectric material, such as aluminum nitride (MN), lead zirconate titanate (PZT), $BaTiO_3$ or $BiFeO_3$ layer. Other suitable types of strain induced materials may also be useful. The strain induced layer may be formed using suitable techniques, such as CVD. The thickness of the strain induced layer may be about, for example, 2-20 nm. Other suitable thicknesses may also be useful.

Referring to FIG. 8l, the strain induced layer is patterned to form a strain induced layer 638 over the DL. Patterning the strain induced layer may be achieved using an anisotropic etch, such as RIE, with a patterned mask layer. Other techniques for defining the strain induced layer may also be useful. The strain induced layer is patterned such that it is within the footprint of a spin-orbit-torque SOT layer and may have a footprint which is larger than the footprint of a storage element which is formed thereover. As shown, a width of the strain induced layer along B-B' is wider than DL. Other suitable configuration for the strain induced layer may also be useful.

As shown in FIG. 8l, the process continues to form a SOT layer 836 over the dielectric layer $690_3$. For example, the SOT layer is formed over M2. The SOT layer is formed over the strain induced layer, the interconnect pads and DL in M2. The SOT layer includes Ta, Pt, Co/Pt or other suitable heavy metals. Other types of SOT layers may also be useful. The SOT layer may be formed using suitable techniques, including CVD. The thickness of the SOT layer, for example, may be about 2-10 nm. Other suitable thickness may also be useful. A planarizing process, such as CMP, may be employed to provide the SOT layer with a planar top surface. However, it is understood that a planarization process may not be needed.

Referring to FIG. 8m, the SOT layer is patterned to define a SOT layer 636 over the strain induced layer 638. Patterning the SOT layer may be achieved using an anisotropic etch, such as RIE, with a patterned mask layer. Other techniques for defining the SOT layer 636 may also be useful. The SOT layer is patterned such that the footprint of the SOT layer is sufficient to accommodate a storage element 610 thereover and large enough to be in electrical contact with the interconnect pads in M2 which are coupled to the drain regions of the transistors.

The process 800 continues to form a storage element 610 of the memory cell as shown in FIG. 8n. In one embodiment, the process forms an MTJ element of the memory cells. For example, various layers of MTJ stack are formed on the dielectric layer and patterned to form the MTJ element of the memory cell. Forming the storage element may include forming the various layers of the MTJ stack on the dielectric layer $690_3$ and over the SOT layer 636. The process may also form a top electrode layer over the MTJ stack layers. The layers may include materials as described in FIGS. 1a-1b and may be formed by various deposition techniques. The deposition techniques may depend on the type of layer. The layers may be patterned to form the MTJ element 610 and a top electrode 632 over the MTJ element. Patterning the layers may be achieved using an anisotropic etch, such as RIE, with a patterned mask layer. Other techniques for forming the MTJ element may also be useful.

Referring to FIG. 8n, a storage dielectric layer $690_4$ is formed over the MTJ element and top electrode. The dielectric layer covers the storage element 610. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the top electrode 632 and provides a planar surface.

In FIG. 8o, a dielectric layer $690_5$ is formed over the substrate, covering the storage dielectric layer. The dielectric layer, for example, serves as a metal level of an ILD layer. In one embodiment, the dielectric layer serves as a metal level of the storage dielectric level. For example, the dielectric layer serves as M3 while the storage dielectric layer serves as V2. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

As shown in FIG. 8o, a conductive or metal line is formed in the dielectric layer $690_5$ and on the storage dielectric layer $690_4$. The metal line may be formed using, for example, damascene technique. For example, a read line RL (or bit line BL) may be formed in the dielectric layer $690_5$. This provides a connection for the storage element to RL. For example, the MTJ element 610 is coupled to the RL.

Additional processes may be performed to complete forming the device. For example, the processes may include forming additional ILD levels, pad level, passivation level, pad opening, dicing, assembly and testing. Other types of processes may also be performed.

FIGS. 9a-9l show cross-sectional views of another embodiment of a process 900 for forming a device. The cross-sectional views are taken along A-A' as shown in FIG. 7a. The process 900 includes forming a memory cell. The memory cell, for example, is the same or similar to that described in FIGS. 7a-7c and the process 900 is similar to process 800 as described in FIGS. 8a-8o. Thus, common elements may not be described or described in detail. In the interest of brevity, the description of the process 900 below primarily focuses on the difference(s) compared with the process 800 described and shown in FIGS. 8a-8o.

As shown in FIG. 9a, a partially processed substrate is provided. The substrate is processed at the stage similar to that described in FIG. 8a. For example, isolation regions 680 and body well 608 are defined in the substrate 605.

Figure 9C:
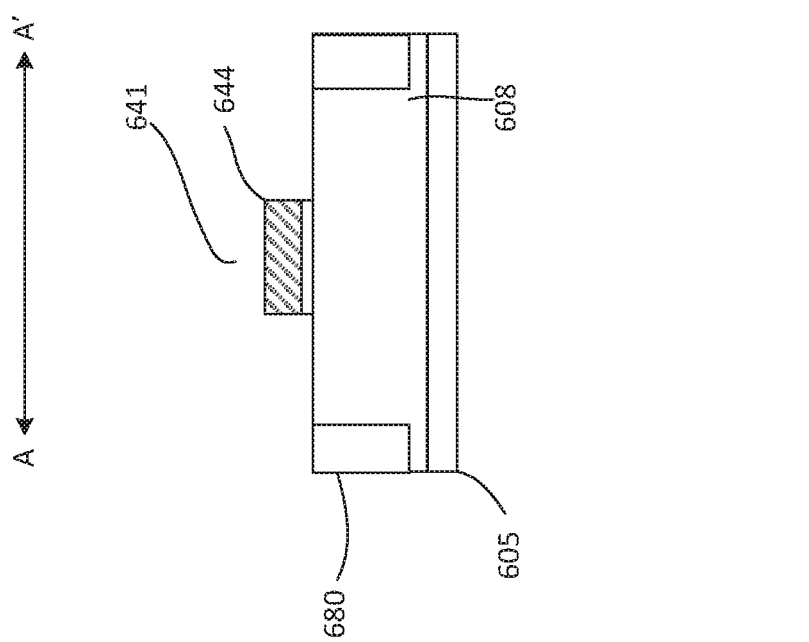

Gate layers are formed on the substrate. The gate layers, in one embodiment, include a gate dielectric layer 822 and a gate electrode layer 824 thereover as shown in FIG. 9b. Materials of the gate layers and techniques for forming the gate layers are the same as that described in FIG. 8b. Referring to FIG. 9c, the gate layers are patterned to form a gate 644 of a select transistor 641 of the memory cell. Patterning the gate layers may be achieved using mask and etch techniques similar to that described in FIG. 8c. The gate 644, for example, may be a gate conductor formed along a first or select line (or word line) direction. A gate conductor forms a common gate for a row of memory cells. The gate conductor may serve as a select line SL.

Figure 9D:
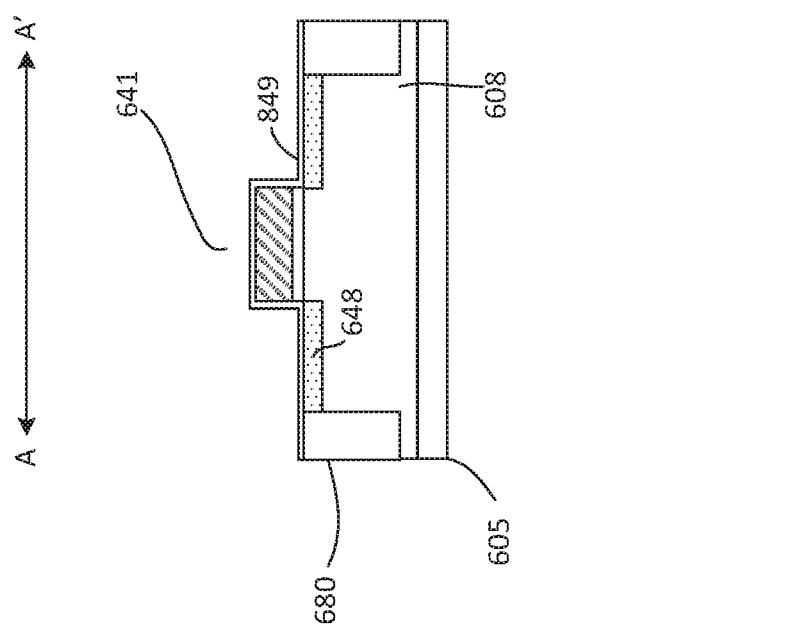

In FIG. 9d, an implant is performed to form LD extension regions 648. The LD extension regions are formed adjacent to first and second sides of the gate 644. A dielectric spacer layer 849, such as silicon oxide, is formed on the substrate covering the gate. Techniques for forming the LD extension regions and spacer layer are the same as that described in FIGS. 8d-8e.

Figure 9E:
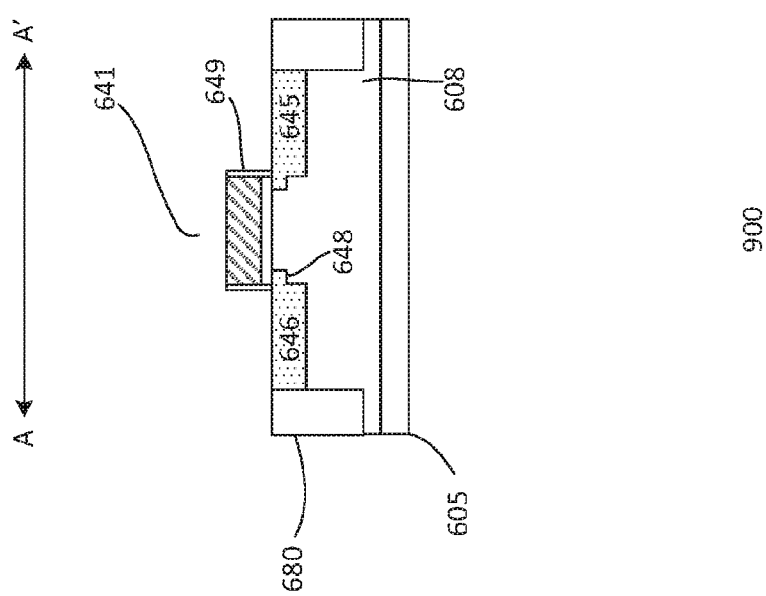

Referring to FIG. 9e, an anisotropic etch, such as RIE, is performed to remove horizontal portions of the spacer layer, leaving spacers 649 to abut the sidewalls of the gate. An implant is performed to form first and second S/D regions of the select transistor 641. An implant mask (not shown) may be used to form the first and second S/D regions 645 and 646 in the substrate. In one embodiment, the implant forms heavily doped first polarity type S/D regions in the substrate adjacent to the gate. The first S/D region 645 may be referred to as a drain region while the second S/D region 646 may be referred to as a source region. Technique for forming the first and second S/D regions are similar to that described in FIG. 8f.

Figure 9F:
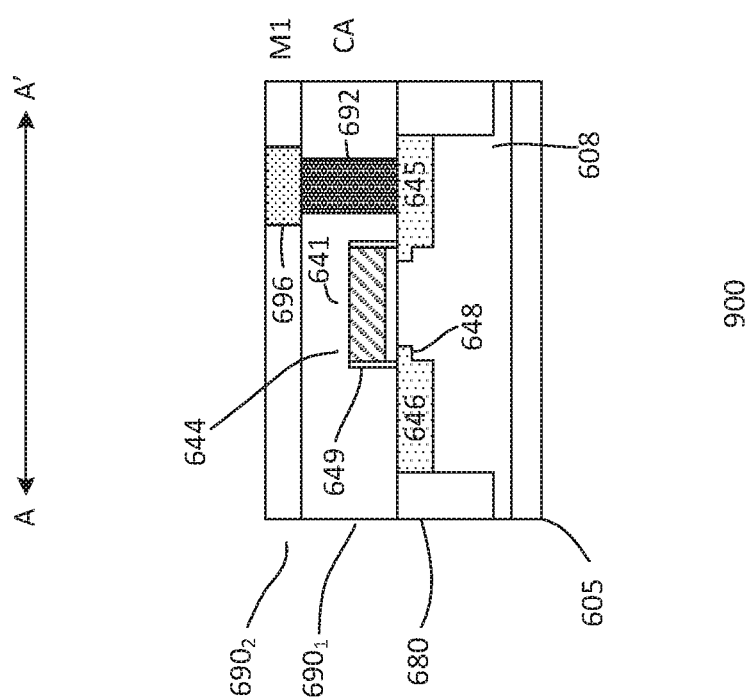
Figure 9G:
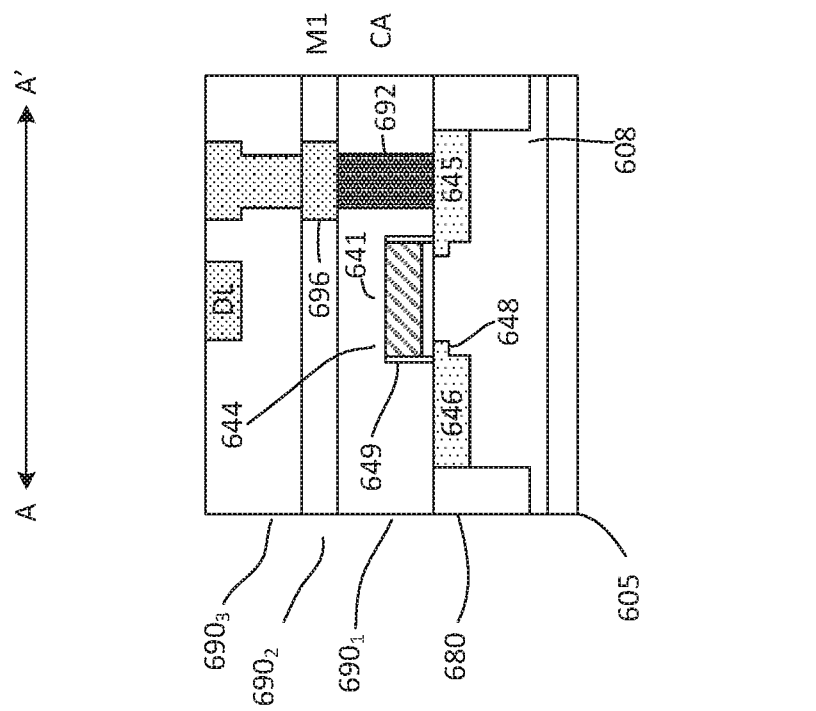

As shown in FIGS. 9f-9g, the process 900 continues by performing the steps similar to that described in FIGS. 8g-8j. For example, the process 900 continues to form a dielectric layer $690_1$ which serves as a PMD or CA level of an ILD layer, contacts 692 in the dielectric layer $690_1$, a dielectric layer $690_2$ which serves as M1 level of the ILD layer, an interconnect pad 696 and a metal line which serves as SrL (not shown) in the dielectric layer $690_2$, a dielectric layer $690_3$ which serves as V1 and M2 level of the ILD layer, interconnect pad and contact as well as the DL in the dielectric layer $690_3$. The contact 692, as shown in FIG. 9f, is coupled to the drain region of the select transistor while SrL (not shown) formed in M1 is coupled to the source region of the select transistor by another contact (not shown). The SrL and the DL are formed in directions orthogonal with each other. Techniques for forming these various dielectric and conductive layers are similar to that described in FIGS. 8g-8j and will not be repeated herein.

Figure 9H:
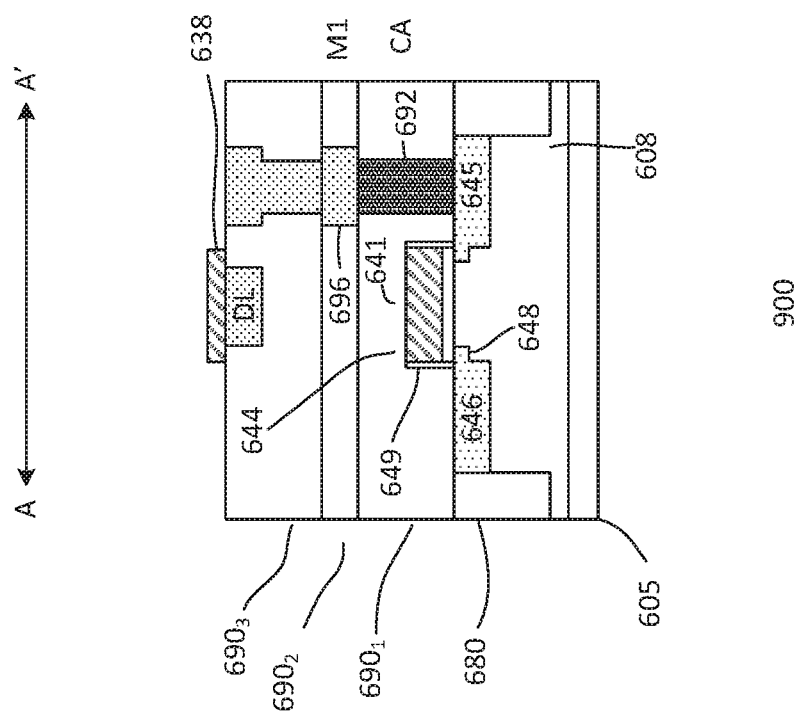
Figure 9I:
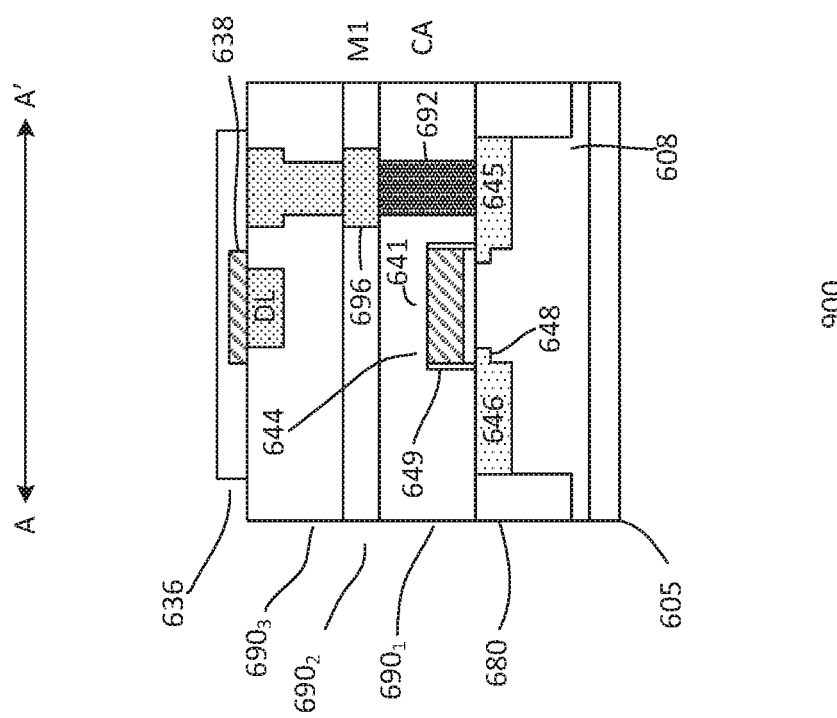

The process 900 continues to form a strain induced layer 638 over the DL as shown in FIG. 9h and to form a SOT layer 636 over the strain induced layer as shown in FIG. 9i.

Materials and techniques for forming the strain induced layer and SOT layer are similar to that described in FIGS. 8k-8m. In one embodiment, the strain induced layer is patterned such that it is within the footprint of the SOT layer and may have a footprint which is larger than the footprint of a storage element which is formed thereover. For example, the width of the patterned strain induced layer along A-A' is wider than DL. Other suitable configuration for the strain induced layer may also be useful. The SOT layer, in one embodiment, is patterned such that the footprint of the SOT layer includes a L-shaped top layout which is sufficiently large to be in electrical connection with a write line WL and a read line RL formed thereover as will be described later. Other suitable configuration or layout for the SOT layer may also be useful.

Figure 9J:
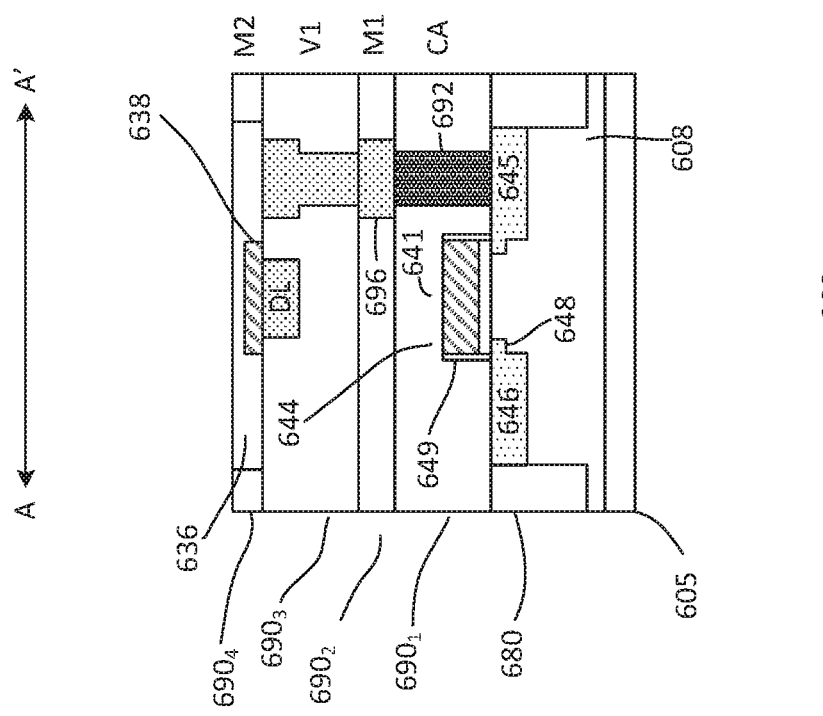

As shown in FIG. 9j, a dielectric layer $690_4$ is formed over the SOT layer 636. The dielectric layer covers the SOT layer. The dielectric layer $690_4$, for example, is a silicon oxide layer. The dielectric layer may be formed by, for example, CVD. Other types of dielectric layers or forming techniques may also be useful. A planarization process is performed to remove excess dielectric material to form a planar surface. The planarization process, for example, is CMP. The planarization process exposes the top of the SOT layer and provides a planar surface.

Figure 9K:
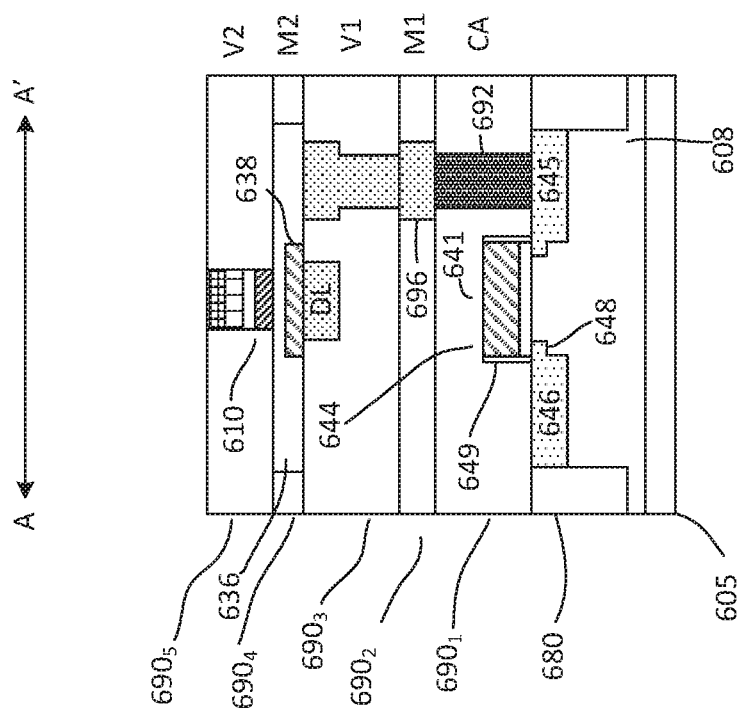
Figure 9I:
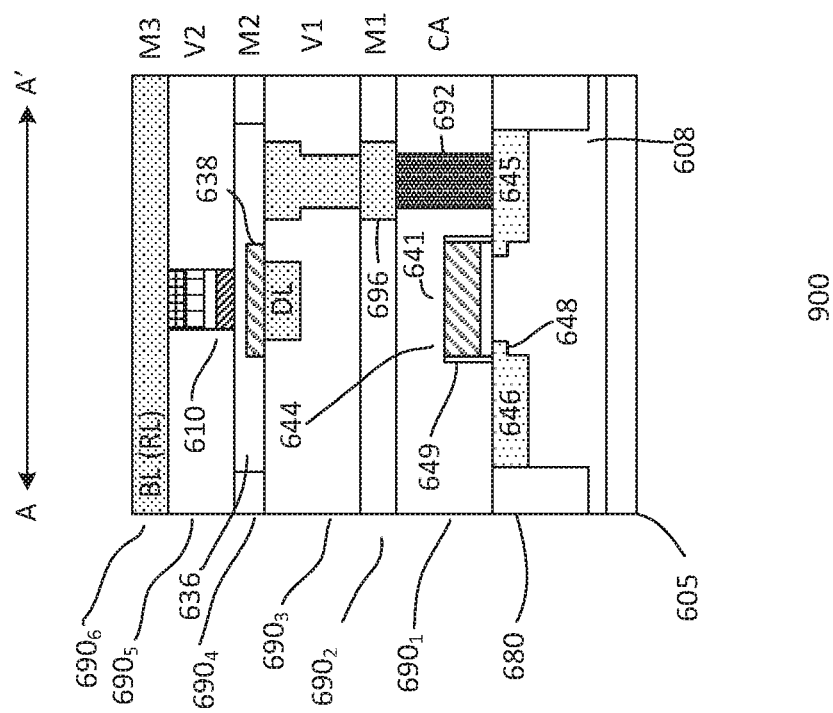

The process 900 continues to form a storage element 610 of the memory cell as shown in FIG. 9k. In one embodiment, the process forms an MTJ element of the memory cell and a top electrode 632 over the MTJ element. A storage dielectric layer $690_5$ is formed over the MTJ element and top electrode. The dielectric layer covers the storage element 610. Materials and techniques for forming and defining the MTJ element and the top electrode as well as the storage dielectric layer are the same as that described in FIG. 8n.

In FIG. 9l, a dielectric layer $690_6$ is formed over the substrate, covering the storage dielectric layer. The dielectric layer, for example, serves as a metal level of an ILD layer. In one embodiment, the dielectric layer serves as a metal level of the storage dielectric level. For example, the dielectric layer serves as M3 while the storage dielectric layer serves as V2. Other ILD levels may also be useful. Material and technique for forming the dielectric layer $690_6$ are similar to that described in FIG. 8o. In one embodiment, metal lines are formed in the dielectric layer $690_6$ and on the storage dielectric layer $690_5$. The metal lines may be formed using suitable techniques, such as but not limited to damascene and/or dual damascene technique. For example, a read line RL (or bit line BL) and a write line WL (not shown) may be formed in the dielectric layer $690_6$. The RL is coupled to the storage element 610. The WL is coupled to the SOT layer 636 by a contact (not shown). The WL and contact may be formed by, for example, a dual damascene technique. The WL and RL are parallel to each other and are perpendicular to the gate. The WL and RL are offset. For example, the SOT layer is L shaped to offset the WL and RL.

Additional processes may be performed to complete forming the device. For example, the processes may include forming additional ILD levels, pad level, passivation level, pad opening, dicing, assembly and testing. Other types of processes may also be performed.

The embodiments as described result in various advantages. The embodiments as described provide for an electric field assisted SOT-MRAM cell for high speed and low power (e.g., write pulse less than 10 ns) applications. In addition, the write and read current paths of the SOT-MRAM cells as described are different during READ and WRITE operations of the memory cell. This does not create READ error problem and the endurance and reliability of the MTJ elements are not jeopardized. In addition, the SOT-MRAM cells as described in this disclosure are energy efficient as low switching current can be achieved by reducing the magnetic anisotropy of the free layer under the applied electric field during WRITE operation. Moreover, the processes as described are also highly compatible with CMOS logic processing and could be implemented using current technology and equipment. Thus, no additional cost is required for implementing the processes as described above.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
   a substrate defined with a memory cell region;
   a cell selector unit defined on the substrate, wherein the cell selector unit comprises at least one select transistor;
   a storage element which comprises a magnetic tunnel junction (MTJ) element coupled to the selector unit, wherein the MTJ element comprises a free layer, a fixed layer and a tunnel barrier sandwiched between the fixed and free layers;
   a spin-orbit-torque (SOT) layer coupled to the selector unit and is in direct contact with the free layer; and
   a strain induced layer coupled to a digital line (DL) and in direct contact with the SOT layer, wherein when the DL is activated, an electric field applied to the strain induced layer induces a strain on the SOT layer.

2. The memory cell of claim 1 wherein the SOT layer comprises heavy metal material and the strain induced layer comprises a piezo electric or a ferroelectric material.

3. The memory cell of claim 1 wherein:
   the cell selector unit comprises first and second select transistors, wherein a select transistor comprises a gate and first and second source/drain (S/D) regions disposed adjacent to first and second sides of the gate;
   the first select transistor serves as a read select transistor and the second select transistor serves as a write select transistor; and
   the first S/D regions of the first and second select transistors serve as drain regions and the second S/D regions of the first and second select transistors serve as source regions.

4. The memory cell of claim 3 wherein:
   a gate of a select transistor serves as a select line (SL) and is a gate conductor which traverses along a SL direction which is parallel to the DL;
   the source region of the first select transistor is coupled to a source line (SrL) which traverses along a direction perpendicular to the SL direction;
   the source region of the second select transistor is coupled to a write line (WL), wherein the WL and SrL are parallel to each other; and
   the drain regions of the first and second select transistors are electrically coupled to the SOT layer.

5. The memory cell of claim 4 wherein the MTJ element is coupled to a read line (RL) disposed over the MTJ element and traverses along a direction parallel to the WL and SrL.

6. The memory cell of claim 5 wherein the WL and SrL are disposed in a first metal level and the DL is disposed in a second metal level above the first metal level.

7. The memory cell of claim 1 wherein a footprint of the SOT layer is sufficient to accommodate the storage element and a footprint of the strain induced layer is larger than a footprint of the storage element.

8. The memory cell of claim 1 wherein:
the cell selector unit comprises one select transistor, wherein the select transistor comprises a gate and first and second source/drain (S/D) regions disposed adjacent to first and second sides of the gate; and
the first S/D region of the select transistor serves as a drain region and the second S/D region of the select transistor serves as a source region.

9. The memory cell of claim 8 wherein:
the gate of the select transistor serves as a select line (SL) and is a gate conductor which traverses along a SL direction which is parallel to the DL;
the source region of the select transistor is coupled to a source line (SrL) which traverses along a direction perpendicular to the SL direction; and
the drain region of the select transistor is electrically coupled to the SOT layer.

10. The memory cell of claim 9 wherein the MTJ element is coupled to a read line (RL) disposed over the MTJ element, and the SOT layer is coupled to a write line (WL), wherein the WL and RL traverse along a direction parallel to the SrL.

11. The memory cell of claim 10 wherein the SrL is disposed in a first metal level, the DL is disposed in a second metal level above the first metal level, and the RL and WL are disposed in a third metal level above the second metal level.

12. The memory cell of claim 11 wherein the SOT layer comprises a L-shaped layout to offset the WL and RL.

13. A method of operating a memory cell comprising:
providing a memory cell comprising
a substrate defined with a memory cell region,
a cell selector unit defined on the substrate, wherein the cell selector unit comprises at least one select transistor,
a storage element which comprises a magnetic tunnel junction (MTJ) element coupled to the selector unit, wherein the MTJ element comprises a free layer, a fixed layer and a tunnel barrier sandwiched between the fixed and free layers,
a spin-orbit-torque (SOT) layer coupled to the selector unit and is in direct contact with the free layer, and
a strain induced layer coupled to a digital line (DL) and in direct contact with the SOT layer; and
performing a read operation or write operation with the memory cell, wherein when a write operation is performed, a write path is formed through the SOT layer and the DL is activated, an electric field to applied to the strain induced layer induces a strain on the SOT layer which reduces magnetic anisotropy of the free layer that is in direct contact with the SOT layer.

14. A method of forming a memory cell comprising:
providing a substrate defined with a memory cell region;
forming a cell selector unit on the substrate, wherein forming the cell selector unit comprises forming at least one select transistor;
forming a storage element which comprises a magnetic tunnel junction (MTJ) element coupled to the selector unit, wherein the MTJ element comprises a free layer, a fixed layer and a tunnel barrier sandwiched between the fixed and free layers;
forming a spin-orbit-torque (SOT) layer and coupling the SOT layer to the selector unit, wherein the SOT layer is formed below and in direct contact with the free layer; and
forming a strain induced layer and coupling the strain induced layer to a digital line (DL) and in direct contact with the SOT layer, wherein when the DL is activated, an electric field applied to the strain induced layer induces a strain on the SOT layer.

15. The method of claim 14 wherein forming the at least one select transistor comprises forming first and second select transistors on the substrate.

16. The method of claim 15 wherein forming the first and second select transistors comprises:
forming gate layers which comprise a gate dielectric layer and a gate electrode layer over the substrate;
patterning the gate layers to form the first and second gates of the select transistors; and
implanting first polarity type dopants to form first and second heavily doped S/D regions adjacent to first and second sides of the gates of the select transistors.

17. The method of claim 16 comprising:
forming a pre-metal dielectric (PMD) layer over the first and second select transistors;
forming metal lines and interconnect pads over the PMD layer, wherein the metal lines comprise a source line (SrL) and a write line (WL), wherein the SrL and WL are parallel to each other and traverse along a direction perpendicular to direction of the gates;
coupling the second S/D region of the first selector transistor to the SrL; and
coupling the second S/D region of the second select transistor to the WL.

18. The method of claim 17 comprising:
forming a dielectric layer over the PMD layer;
forming a metal line and interconnect pads in the dielectric layer, wherein the metal line comprises the DL which traverses along a direction parallel to the gates;
forming a storage dielectric layer over the dielectric layer and DL, wherein the storage element is formed within the storage dielectric layer;
forming an upper dielectric layer over the storage dielectric layer;
forming a metal line in the upper dielectric layer, wherein the metal line in the upper dielectric layer comprises a read line (RL) and coupling the RL to the storage element.

19. The method of claim 14 wherein forming the at least one select transistor comprises forming a select transistor which comprises:
forming gate layers which comprise a gate dielectric layer and a gate electrode layer over the substrate;
patterning the gate layers to form the gate of the select transistor; and
implanting first polarity type dopants to form first and second heavily doped S/D regions adjacent to first and second sides of the gate of the select transistor.

20. The method of claim 19 comprising:
forming a pre-metal dielectric (PMD) layer over the select transistor;
forming a metal line and interconnect pads over the PMD layer, wherein the metal line comprises a source line (SrL), wherein the SrL traverses along a direction perpendicular to direction of the gate;

coupling the first S/D region of the select transistor to the SOT layer; and coupling the second S/D region of the selector transistor to the SrL.

* * * * *